US011398522B2

(12) United States Patent
Yamakawa

(10) Patent No.: US 11,398,522 B2
(45) Date of Patent: Jul. 26, 2022

(54) SOLID-STATE IMAGING DEVICE, MANUFACTURING METHOD THEREOF, AND ELECTRONIC DEVICE

(71) Applicant: SONY SEMICONDUCTOR SOLUTIONS CORPORATION, Kanagawa (JP)

(72) Inventor: Shinya Yamakawa, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 507 days.

(21) Appl. No.: 16/341,786

(22) PCT Filed: Nov. 1, 2017

(86) PCT No.: PCT/JP2017/039472
§ 371 (c)(1),
(2) Date: Apr. 12, 2019

(87) PCT Pub. No.: WO2018/088285
PCT Pub. Date: May 17, 2018

(65) Prior Publication Data
US 2021/0335880 A1 Oct. 28, 2021

(30) Foreign Application Priority Data

Nov. 14, 2016 (JP) .............................. JP2016-221188

(51) Int. Cl.
H01L 27/146 (2006.01)
H01L 25/04 (2014.01)
(Continued)

(52) U.S. Cl.
CPC .. *H01L 27/14689* (2013.01); *H01L 27/14605* (2013.01); *H01L 27/14636* (2013.01);
(Continued)

(58) Field of Classification Search
CPC ....... H01L 27/14603–14607; H01L 27/14636; H01L 27/14645; H01L 27/14649;
(Continued)

(56) References Cited

U.S. PATENT DOCUMENTS 9,018,688 B2* 4/2015 Yamaguchi ....... H01L 27/14645
257/292
2005/0104089 A1* 5/2005 Engelmann ............ H04N 5/365
257/204
(Continued)

FOREIGN PATENT DOCUMENTS

CN 102983143 A 3/2013
CN 104541372 A 4/2015
(Continued)

OTHER PUBLICATIONS

International Search Report and Written Opinion of PCT Application No. PCT/JP2017/039472, dated Dec. 19, 2017, 10 pages of ISRWO.

*Primary Examiner* — Scott B Geyer
(74) *Attorney, Agent, or Firm* — Chip Law Group

(57) ABSTRACT

The present technology relates to a solid-state imaging device, a manufacturing method thereof, and an electronic device that enable improvement of the sensitivity in a near infrared region by a simpler process. A solid-state imaging device includes: a first semiconductor layer in which a first photoelectric conversion unit and a first floating diffusion are formed; a second semiconductor layer in which a second photoelectric conversion unit and a second floating diffusion are formed; and a wiring layer including a wiring electrically connected to the first and second floating diffusions. The first semiconductor layer and the second semiconductor layer are laminated, and the wiring layer is formed on a side of the first or second semiconductor layer, the side being opposite to a side on which the first semiconductor layer and the second semiconductor layer face each other. The present technology can be applied to a CMOS image sensor.

14 Claims, 19 Drawing Sheets

(51) Int. Cl.
*H01L 25/065* (2006.01)
*H01L 25/16* (2006.01)
*H01L 25/00* (2006.01)

(52) U.S. Cl.
CPC .. *H01L 27/14643* (2013.01); *H01L 27/14645* (2013.01); *H01L 27/14647* (2013.01); *H01L 27/14649* (2013.01); *H01L 27/14652* (2013.01); *H01L 27/14687* (2013.01); *H01L 25/043* (2013.01); *H01L 25/0657* (2013.01); *H01L 25/167* (2013.01); *H01L 25/50* (2013.01)

(58) Field of Classification Search
CPC ......... H01L 27/14687; H01L 27/14689; H01L 27/14647; H01L 25/043; H01L 25/0657; H01L 25/074; H01L 25/167; H01L 25/50; H01L 27/14609–14616; H01L 27/14643; H01L 27/14652; H01L 27/14641
See application file for complete search history.

(56) References Cited

U.S. PATENT DOCUMENTS

| | | | |
|---|---|---|---|
| 2011/0019063 A1* | 1/2011 | Watanabe | H01L 27/14689 348/340 |
| 2011/0109776 A1 | 5/2011 | Kawai | |
| 2012/0193689 A1* | 8/2012 | Park | H01L 27/14647 257/290 |
| 2013/0057699 A1 | 3/2013 | Ooki | |
| 2013/0234029 A1* | 9/2013 | Bikumandla | H01L 27/1464 250/349 |
| 2015/0054962 A1 | 2/2015 | Borthakur et al. | |
| 2015/0171146 A1 | 6/2015 | Ooki et al. | |
| 2016/0197116 A1 | 7/2016 | Ikeda et al. | |
| 2017/0092686 A1* | 3/2017 | Kasai | H01L 27/308 |
| 2017/0162618 A1 | 6/2017 | Ooki et al. | |
| 2018/0013961 A1* | 1/2018 | Lee | H01L 27/14605 |
| 2018/0069046 A1* | 3/2018 | Jin | H01L 27/14627 |
| 2018/0122846 A1* | 5/2018 | Roy | H01L 27/0688 |
| 2018/0190708 A1* | 7/2018 | Lee | H01L 27/14689 |

FOREIGN PATENT DOCUMENTS

| | | |
|---|---|---|
| EP | 2879181 A1 | 6/2015 |
| JP | 54-059891 A | 5/1979 |
| JP | 2011-103335 A | 5/2011 |
| JP | 2011-530165 A | 12/2011 |
| JP | 2012-015417 A | 1/2012 |
| JP | 2013-070030 A | 4/2013 |
| JP | 2015-032687 A | 2/2015 |
| JP | 2015-162604 A | 9/2015 |
| KR | 10-2015-0037810 A | 4/2015 |
| TW | 201411821 A | 3/2014 |
| WO | 2014/017314 A1 | 1/2014 |
| WO | 2015/016140 A1 | 2/2015 |
| WO | 2015/129810 A1 | 9/2015 |

* cited by examiner

FIG. 6A
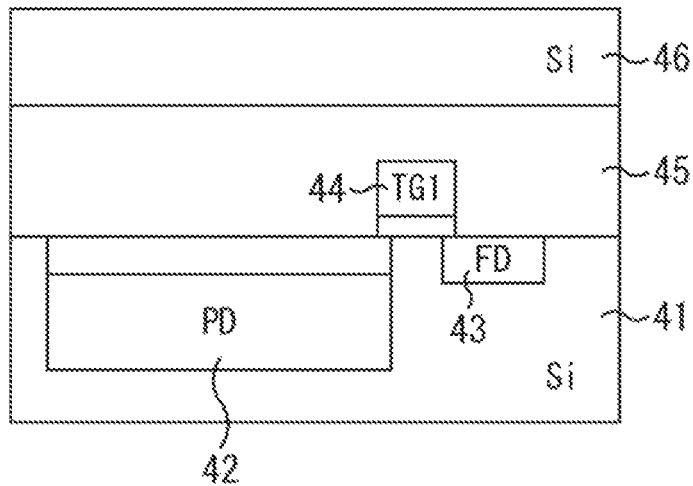
FIG. 6B
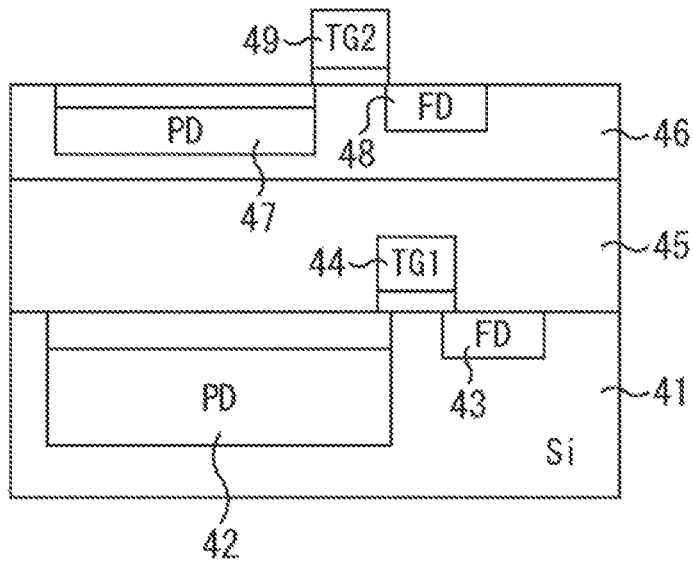

FIG. 7A
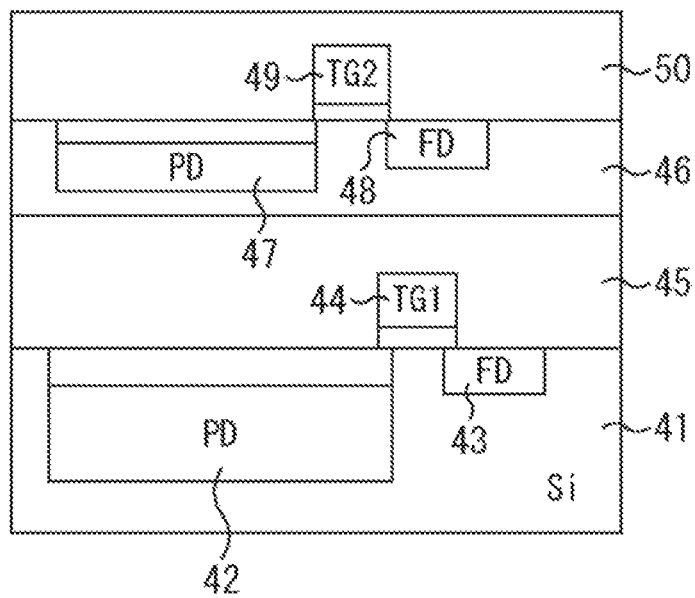
FIG. 7B
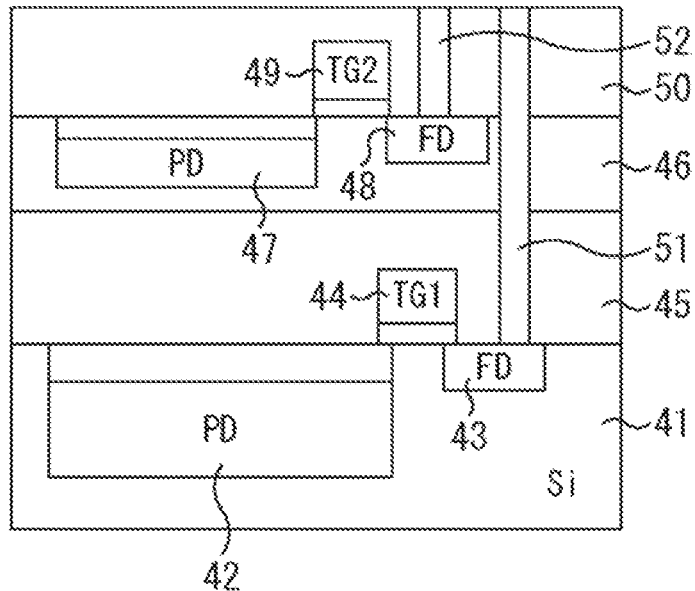

SOLID-STATE IMAGING DEVICE, MANUFACTURING METHOD THEREOF, AND ELECTRONIC DEVICE

CROSS REFERENCE TO RELATED APPLICATIONS

This application is a U.S. National Phase of International Patent Application No. PCT/JP2017/039472 filed on Nov. 1, 2017, which claims priority benefit of Japanese Patent Application No. JP 2016-221188 filed in the Japan Patent Office on Nov. 14, 2016. Each of the above-referenced applications is hereby incorporated herein by reference in its entirety.

TECHNICAL FIELD

The present technology relates to a solid-state imaging device, a manufacturing method thereof, and an electronic device, and in particular, to a solid-state imaging device, a manufacturing method thereof, and an electronic device that enable improvement of the sensitivity in a near infrared region.

BACKGROUND ART

Conventionally, a method of forming a pixel by laminating a photodiode and a reading circuit is known in a field of complementary metal oxide semiconductor (CMOS) type solid-state imaging device.

For example, Patent Document 1 discloses an image sensor in which a second sensor layer is laminated on a first sensor layer, and a circuit layer is formed below the first sensor layer. Between pixels of each sensor layer and between a pixel of the first sensor layer and a circuit of a circuit layer are connected by an interlayer connector.

Laminating a photodiode and a reading circuit in this manner makes it possible to increase a light receiving area of a pixel and improve the sensitivity.

On the other hand, in recent years, there is a solid-state imaging device that performs imaging using infrared light for sensing.

CITATION LIST

Patent Document

Patent Document 1: Japanese Patent Application Laid-Open No. 2011-530165

SUMMARY OF THE INVENTION

Problems to be Solved by the Invention

However, in general, since an indirect transition type semiconductor such as Si or Ge is used for a semiconductor substrate included in a solid-state imaging device, the sensitivity in the near infrared region is particularly low.

There is a limit to further increase the light receiving area of a pixel for improving the sensitivity in the near infrared region. Furthermore, although it is possible to improve the sensitivity in the near infrared region by increasing the thickness of the semiconductor layer, new equipment investment for implanting impurities deeply or performing epitaxial growth a plurality of times is required, and the manufacturing cost increases.

Moreover, in the configuration disclosed in Patent Document 1, it is difficult to form the wiring through an interlayer connector in a case where the semiconductor layer is made thick. Furthermore, since the sensor layers are bonded with each other after the photodiodes are formed in each sensor layer, the accuracy of bonding for adjusting the positions of the photodiodes of each sensor layers with respect to each other is required.

The present technology has been made in view of such a situation, and is intended to improve the sensitivity in a near infrared region by a simpler process.

Solutions to Problems

A solid-state imaging device according to the present technology includes: a first semiconductor layer in which a first photoelectric conversion unit and a first floating diffusion are formed; a second semiconductor layer in which a second photoelectric conversion unit and a second floating diffusion are formed; and a wiring layer including a wiring electrically connected to the first and second floating diffusions, in which the first semiconductor layer and the second semiconductor layer are laminated with each other, and the wiring layer is formed on a side of the first or the second semiconductor layer, the side being opposite to a side on which the first semiconductor layer and the second semiconductor layer face each other.

The second semiconductor layer may be laminated on the first semiconductor layer, and the wiring layer may be formed in an upper layer than the second semiconductor layer.

An isoelectronic trap may be formed in the second photoelectric conversion unit.

The second semiconductor layer may be laminated on the first semiconductor layer, and the wiring layer may be formed in a lower layer than the first semiconductor layer.

A manufacturing method of a solid-state imaging device according to the present technology includes steps of: forming a first photoelectric conversion unit and a first floating diffusion in a first semiconductor layer; laminating a second semiconductor layer on the first semiconductor layer; forming a second photoelectric conversion unit and a second floating diffusion in the second semiconductor layer; and forming a wiring layer including a wiring electrically connected to the first and second floating diffusions on a side of the first or the second semiconductor layer, the side being opposite to a side on which the first semiconductor layer and the second semiconductor layer face each other.

An electronic device according to the present technology includes a solid-state imaging device including: a first semiconductor layer in which a first photoelectric conversion unit and a first floating diffusion are formed; a second semiconductor layer in which a second photoelectric conversion unit and a second floating diffusion are formed; and a wiring layer including a wiring electrically connected to the first and second floating diffusions, in which the first semiconductor layer and the second semiconductor layer are laminated with each other, and the wiring layer is formed on a side of the first or the second semiconductor layer, the side being opposite to a side on which the first semiconductor layer and the second semiconductor layer face each other.

In the present technology, the first semiconductor layer and the second semiconductor layer are laminated, and the wiring layer is formed on the side of the first or second semiconductor layer, the side being opposite to a side on which the first semiconductor layer and the second semiconductor layer face each other.

Effects of the Invention

According to the present technology, sensitivity in a near infrared region can be improved by a simpler process. Note that the effects described herein are not necessarily limited, and any of the effects described in the present disclosure may be applied.

BRIEF DESCRIPTION OF DRAWINGS

FIGS. 6A and 6B are diagrams for explaining processes of pixel formation.

FIGS. 7A and 7B are diagrams for explaining processes of pixel formation.

MODE FOR CARRYING OUT THE INVENTION

Hereinafter, modes (hereinafter referred to as embodiments) for implementing the present disclosure will be described. Note that the description will be given in the following order.

Figure 1:
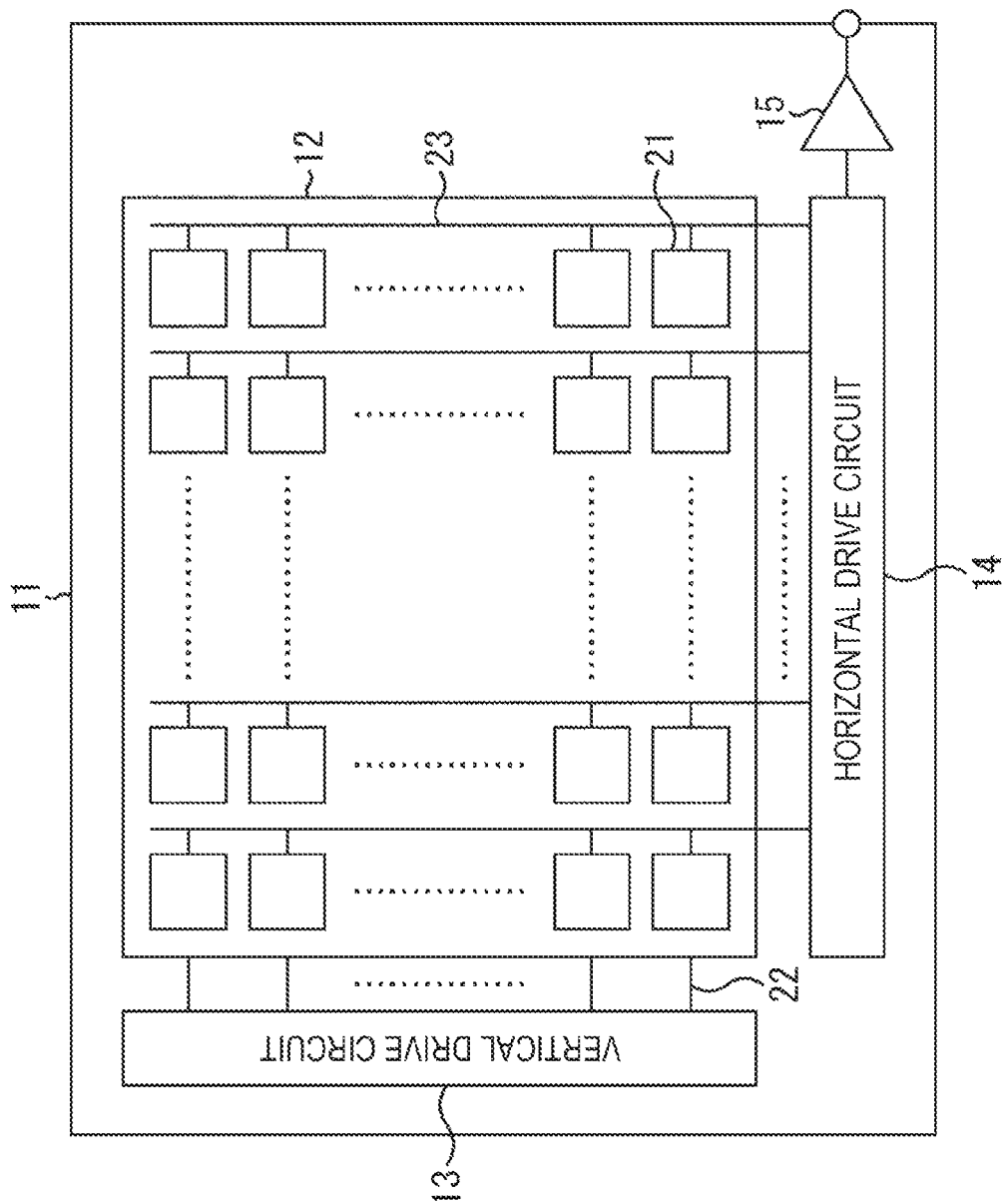
FIG. 1 is a block diagram showing a configuration example of a solid-state imaging device according to an embodiment to which the present technology is applied.

1. Configuration Example of Solid-State Imaging Device
2. First Embodiment
3. Isoelectronic Trap
4. Second Embodiment
5. Third Embodiment
6. Fourth Embodiment
7. Fifth Embodiment
8. Configuration Example of Electronic Device
9. Usage Example of Image Sensor
10. Application Example to Mobile Body 1. Configuration Example of Solid-State Imaging Device FIG. 1 is a block diagram showing a configuration example of a solid-state imaging device according to an embodiment to which the present technology is applied. The solid-state imaging device of FIG. 1 is configured as, for example, a complementary metal oxide semiconductor (CMOS) image sensor.

A solid-state imaging device 11 in FIG. 1 includes a pixel array unit 12, a vertical drive circuit 13, a horizontal drive circuit 14, and an output circuit 15.

A plurality of pixels 21 are arranged in a matrix in the pixel array unit 12. Each of the pixels 21 is connected to the vertical drive circuit 13 for each row by a horizontal signal line 22 and is connected to the horizontal drive circuit 14 for each column by a vertical signal line 23.

The vertical drive circuit 13 outputs a drive signal via the horizontal signal line 22 to drive the pixels 21 arranged in the pixel array unit 12 for each row.

The horizontal drive circuit 14 performs column processing for detecting a signal level by correlated double sampling (CDS) operation from a signal output from each pixel 21 of the pixel array unit 12 via the vertical signal line 23, and outputs an output signal corresponding to a charge generated by photoelectric conversion in the pixel 21 to the output circuit 15.

The output circuit 15 amplifies the output signal sequentially output from the horizontal drive circuit 14 to a voltage value of a predetermined level, and outputs the amplified signal to an image processing circuit or the like in the subsequent stage.

2. First Embodiment

Figure 2:
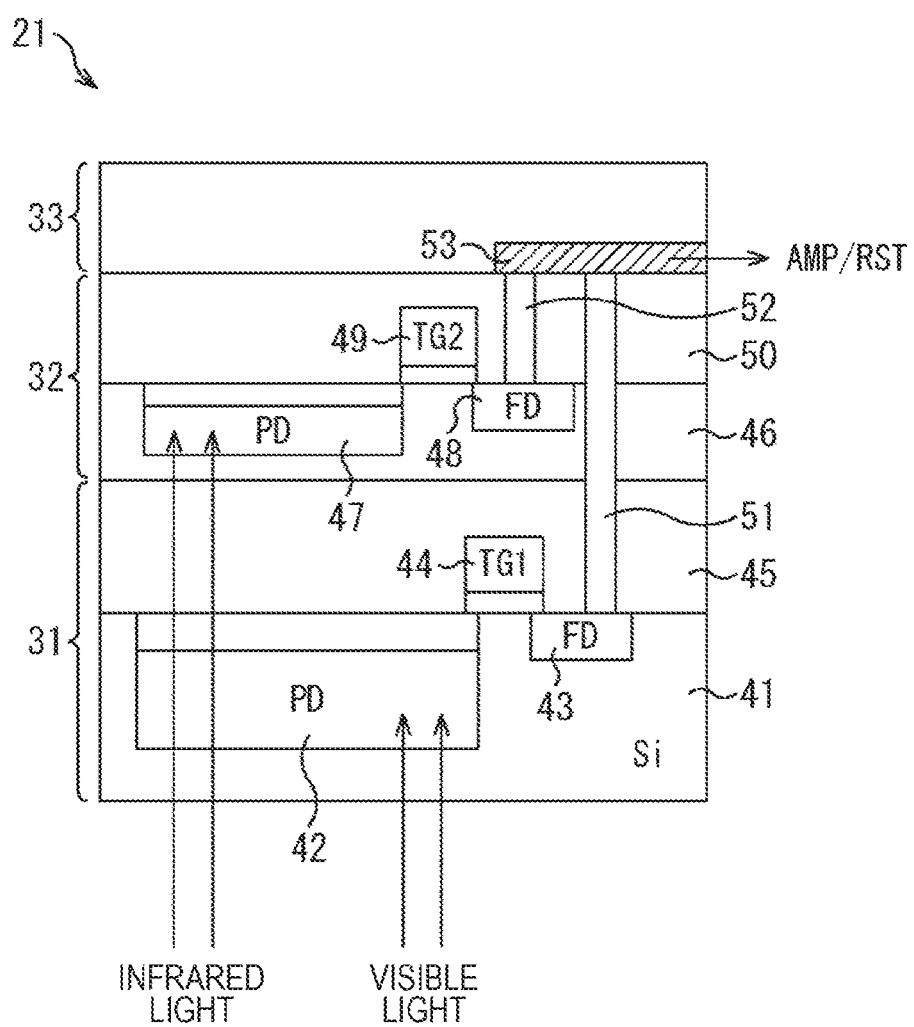
FIG. 2 is a cross-sectional view showing a configuration example of a pixel of a first embodiment.

FIG. 2 is a cross-sectional view showing a configuration example of the pixel 21 of a first embodiment.

The pixel 21 shown in FIG. 2 has a structure of a so-called back-illuminated solid-state imaging device. Note that the structure of the back-illuminated solid-state imaging device is disclosed in detail in, for example, Japanese Patent No. 3759435 filed by the present applicant.

The pixel 21 shown in FIG. 2 is formed by laminating a first semiconductor layer 31, a second semiconductor layer 32, and a wiring layer 33. Specifically, the second semiconductor layer 32 is laminated on the first semiconductor layer 31, and the wiring layer 33 is formed in an upper layer than the second semiconductor layer 32.

In the first semiconductor layer 31, for example, a photodiode (PD) 42 including a PN junction is formed in a P type Si substrate 41. The PD 42 is a photoelectric conversion unit that converts incident light into an electric charge by photoelectric conversion and accumulates the electric charge. The PD 42 is connected to a floating diffusion (FD) 43 formed as an N+ region via a transfer transistor 44 (TG1).

On the Si substrate 41, an interlayer insulating film 45 including, for example, SiO2 and the like is formed.

In the second semiconductor layer 32, a PD 47 including a PN junction is formed in a Si layer 46. The PD 47 is also a photoelectric conversion unit that converts incident light into an electric charge by photoelectric conversion and accumulates the electric charge. The PD 47 is connected to a FD 48 formed as an N+ region via a transfer transistor 49 (TG2). On the Si layer 46, an interlayer insulating film 50 including, for example, SiO2 and the like is formed.

Note that in the present embodiment, the first semiconductor layer 31 and the second semiconductor layer 32 include Si, but may include Ge or SiGe, or include a III-V compound.

A metal wiring 53 is formed in the wiring layer 33. One end of the metal wiring 53 is connected to an amplification transistor 63 or a reset transistor 65 as described later.

Furthermore, the FD 43 of the first semiconductor layer 31 is electrically connected to the metal wiring 53 by a contact via 51, and the FD 48 of the second semiconductor layer 32 is electrically connected to the metal wiring 53 by a contact via 52.

Figure 3:
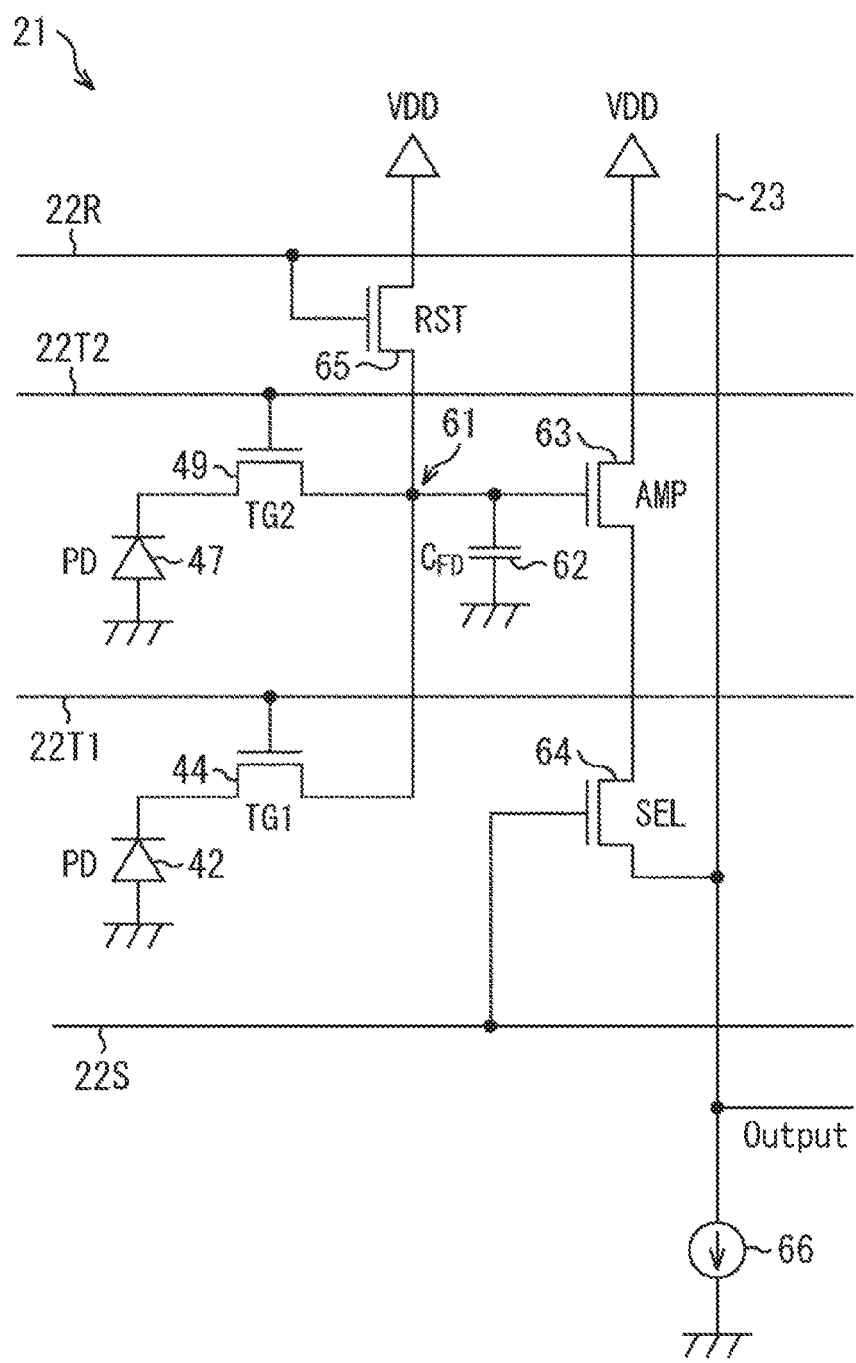
FIG. 3 is a circuit diagram showing a configuration example of a pixel.

FIG. 3 is a circuit diagram showing a configuration example of the pixel 21.

The pixel 21 shown in FIG. 3 includes the PD 42, the transfer transistor 44 (TG1), the PD 47, the transfer transistor 49 (TG2), the amplification transistor 63, a selection transistor 64, and the reset transistor 65. The connection point between the transfer transistor 44 and the transfer transistor 49 and the amplification transistor 63 constitutes the FD 61. A capacity 62 ($C_{FD}$) of the FD 61 is the sum of the capacity of the FD 43 and the capacity of the FD 48 of FIG. 2.

The transfer transistor 44 is driven according to the transfer signal supplied from the vertical drive circuit 13 (FIG. 1) via a horizontal signal line 22T1, and is turned on at the timing when the transfer signal becomes a high level in a pulse form. When the transfer transistor 44 is turned on, the electric charge generated in the PD 42 is transferred to the FD 61 (FD 43) through the transfer transistor 44.

The transfer transistor 49 is driven according to the transfer signal supplied from the vertical drive circuit 13 via a horizontal signal line 22T2, and is turned on at the timing when the transfer signal becomes a high level in a pulse form. When the transfer transistor 49 is turned on, the electric charge generated in the PD 47 is transferred to the FD 61 (FD 48) through the transfer transistor 49.

The FD 61 (FD 43 and FD 48) is connected to the gate electrode of the amplification transistor 63. The amplification transistor 63 outputs a voltage at a level corresponding to the electric charge accumulated in the FD 61, in other words, a voltage at a level corresponding to the electric charge generated in the PD 42 and the PD 47 by photoelectric conversion and transferred to the FD 61.

The selection transistor 64 is driven according to the selection signal supplied from the vertical drive circuit 13 via a horizontal signal line 22S, and is turned on at the timing when the selection signal becomes a high level in a pulse form. When the selection transistor 64 is turned on, the voltage output from the amplification transistor 63 can be output to the vertical signal line 23 via the selection transistor 64.

For example, a plurality of pixels 21 are connected to the vertical signal line 23, and signals from the desired PD 42, PD 47 are output when the selection transistor 64 in a specific line (row) is turned on. Note that the vertical signal line 23 is connected to a constant current source 66 of the horizontal drive circuit 14 of FIG. 1, and a signal indicating the level corresponding to the electric charge accumulated in the FD 61 is output by a source follower circuit including the amplification transistor 63 and the constant current source 66.

The reset transistor 65 is driven according to the reset signal supplied from the vertical drive circuit 13 via a horizontal signal line 22R, and is turned on at the timing when the reset signal becomes a high level in a pulse form. When the reset transistor 65 is turned on, the electric charge accumulated in the FD 61 is discharged to the constant voltage source VDD via the reset transistor 65, and the FD 61 is reset.

Note that the pixel transistor such as the amplification transistor 63, the selection transistor 64, or the reset transistor 65 shown in FIG. 3 may be formed in the first semiconductor layer 31 in FIG. 2, or may be formed in the second semiconductor layer 32.

Figure 4:
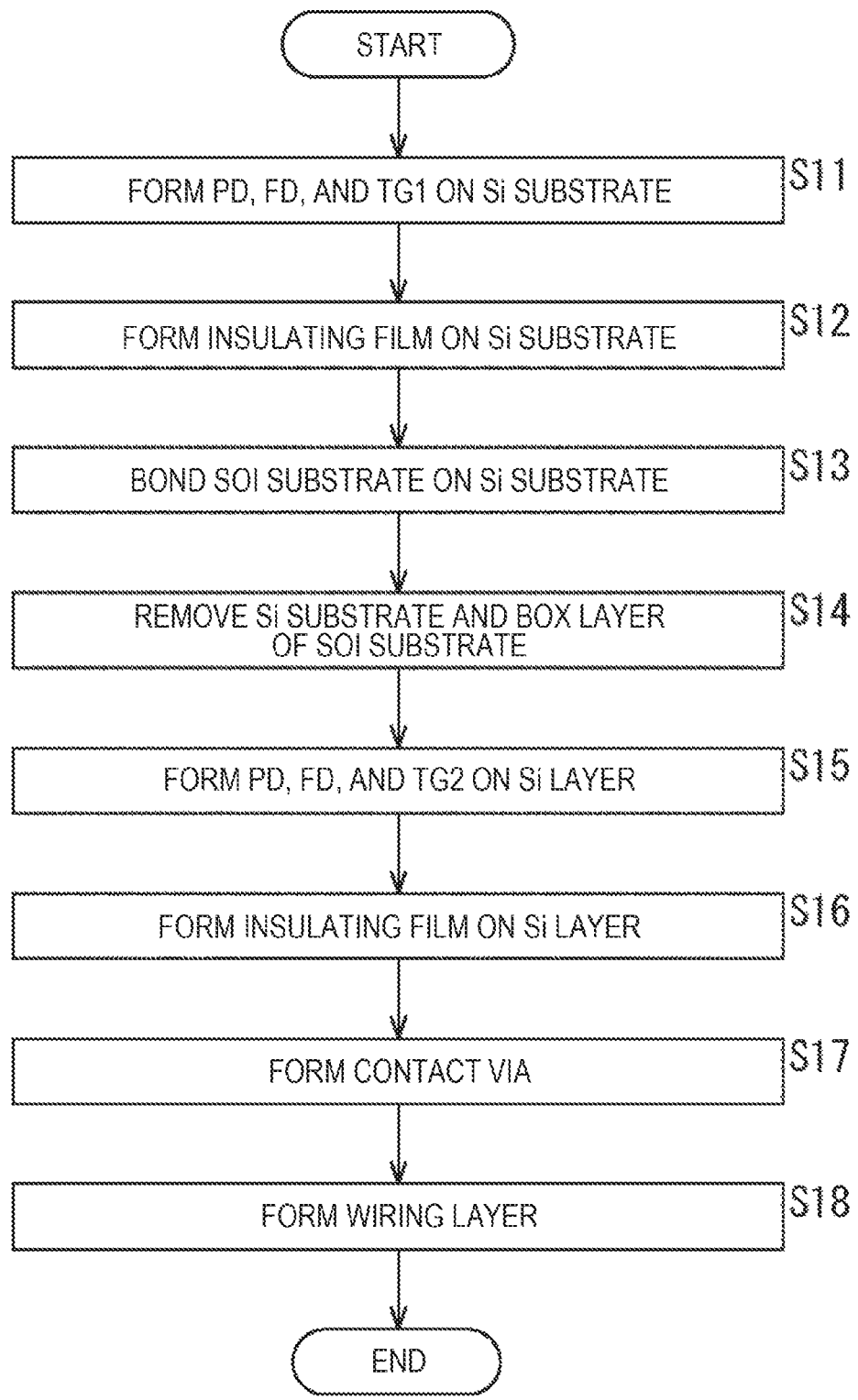
FIG. 4 is a flowchart for explaining pixel formation processing.

Next, with reference to FIGS. 4, 5A, 5B, 5C, 6A, 6B, 7A, 7B, and 8, a flow of pixel formation according to the present embodiment will be described. FIG. 4 is a flowchart for explaining the pixel formation processing, and FIGS. 5A, 5B, 5C, 6A, 6B, 7A, 7B, and 8 are cross-sectional views showing processes of pixel formation.

Figure 5A:
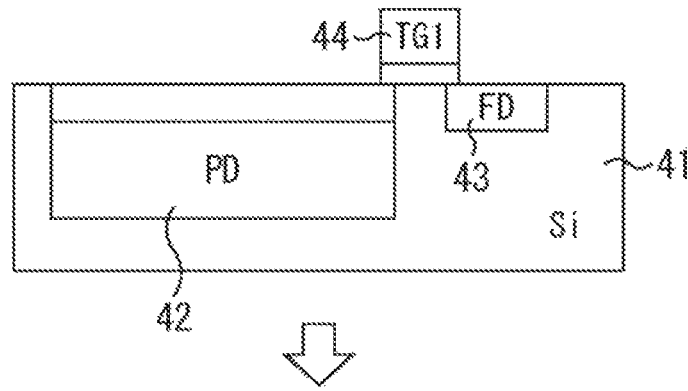
FIGS. 5A, 5B, and 5C are diagrams for explaining processes of pixel formation.

In step S11, as shown in the process in FIG. 5A, the PD 42, the FD 43, and the transfer transistor 44 (TG1) are formed on the Si substrate 41.

First, a P type Si epitaxial layer is prepared. The concentration of the Si epitaxial layer is set to about 1E16 to 1E18 $cm^{-3}$. Here, it is assumed that separation of PD is performed using a P type Si epitaxial layer. The separation of PD may be performed by P type impurity implantation using a thin P type epitaxial layer or may be performed by P type impurity implantation using an N type epitaxial layer.

Next, an oxide film of about 3 to 10 nm is formed on the Si surface by a thermal oxidation process. Moreover, after polysilicon to be a gate electrode is formed, the TG1 is formed by a lithography process and an etching process so as to have a desired shape.

Thereafter, an N type region and a P type region to be PD are formed by impurity implantation. The N type region is formed to have an impurity concentration of 1E15 to 1E18 $cm^{-3}$ and a depth of about 1 to 5 μm. The P type region is formed to have an impurity concentration of 1E18 to 1E19 $cm^{-3}$ and a depth of about 30 to 200 nm.

Moreover, N type impurities are implanted into the region to be the FD so that the concentration is about 1E19 to 1E20 $cm^{-3}$. Then, activation annealing is performed for about 1 to 10 seconds at about 1000 to 1100° C.

Figure 5B:
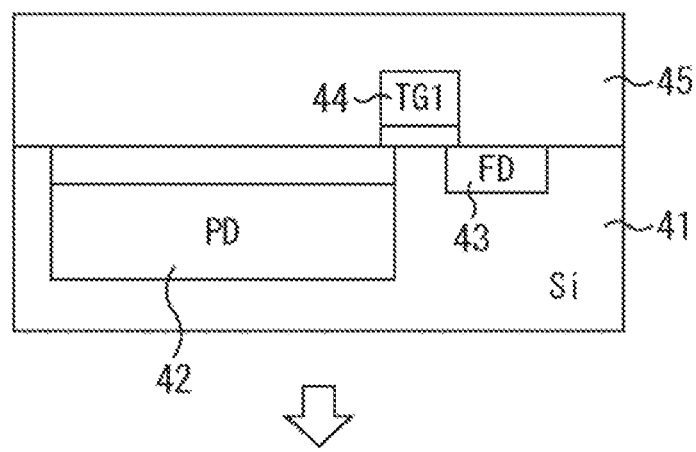

In step S12, as shown in the process in FIG. 5B, the interlayer insulating film 45 including SiO2 or the like is formed on the Si substrate 41. The surface (upper surface) of the interlayer insulating film 45 is planarized by the chemical mechanical polishing (CMP) method or the like.

Figure 5C:
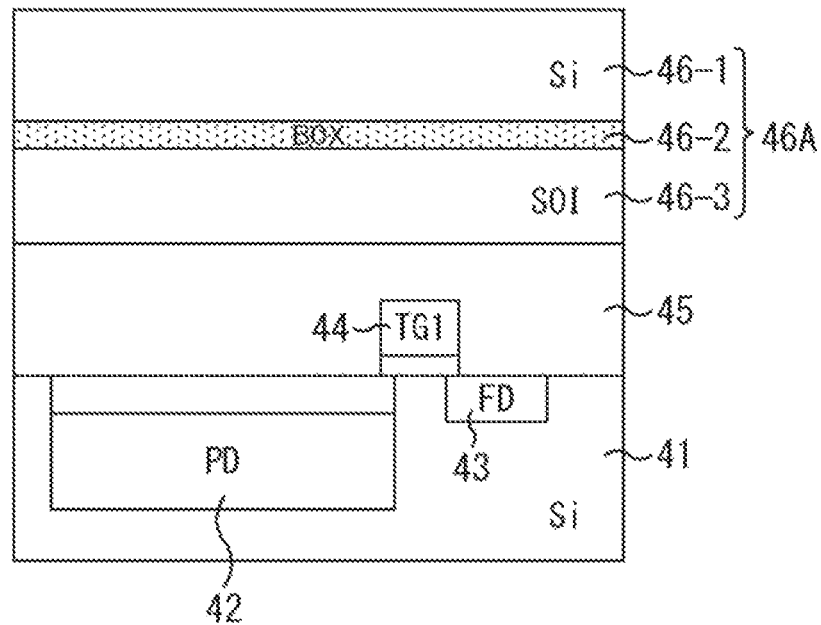

In step S13, as shown in the process in FIG. 5C, a silicon on insulator (SOI) substrate 46A is bonded onto the Si substrate 41 (interlayer insulating film 45). The SOI substrate has a structure in which a buried oxide (BOX) layer 46-2, which is an SiO2 film, is sandwiched between an Si substrate 46-1 and an Si layer 46-3.

Here, in order to increase the bonding strength, plasma treatment may be applied to the bonding surface in advance. Note that, in the present embodiment, an SOI substrate is used as a substrate to be bonded onto the Si substrate 41, but a bulk substrate (Si substrate) may be used.

In step S14, the Si substrate 46-1 and the BOX layer 46-2 of the SOI substrate 46A are removed by the CMP method or the like. As a result, as shown in the process in FIG. 6A, the Si layer 46 is formed on the Si substrate 41 (interlayer insulating film 45). Note that in a case where a bulk substrate is used as the substrate to be bonded on the Si substrate 41, the Si layer is removed by the CMP method or the like so that the thickness thereof is the desired thickness.

In step S15, as shown in the process in FIG. 6B, the PD 47, the FD 48, and the transfer transistor 49 (TG2) are formed in the Si layer 46. Here, although basically the similar process to step S11 is performed, it is desirable that the temperature process such as activation annealing be performed at 600 to 700° C. in order not to change the characteristics of the PD 42 of the first semiconductor layer or the gate electrode (TG1).

In step S16, as shown in the process in FIG. 7A, the interlayer insulating film 50 including SiO2 or the like is formed on the Si layer 46. The surface (upper surface) of the interlayer insulating film 50 is planarized by the CMP method or the like.

In step S17, as shown in the process in FIG. 7B, the contact vias 51, 52 are formed. Specifically, a contact via hole penetrating through the interlayer insulating film 50, the Si layer 46, and the interlayer insulating film 45 is opened with respect to the FD 43, and a contact via hole penetrating the interlayer insulating film 50 is opened with respect to the FD 48. Thereafter, the contact vias 51, 52 are formed by metals such as TaN, W, Cu, Mo or Ni in each contact via hole.

Figure 8:
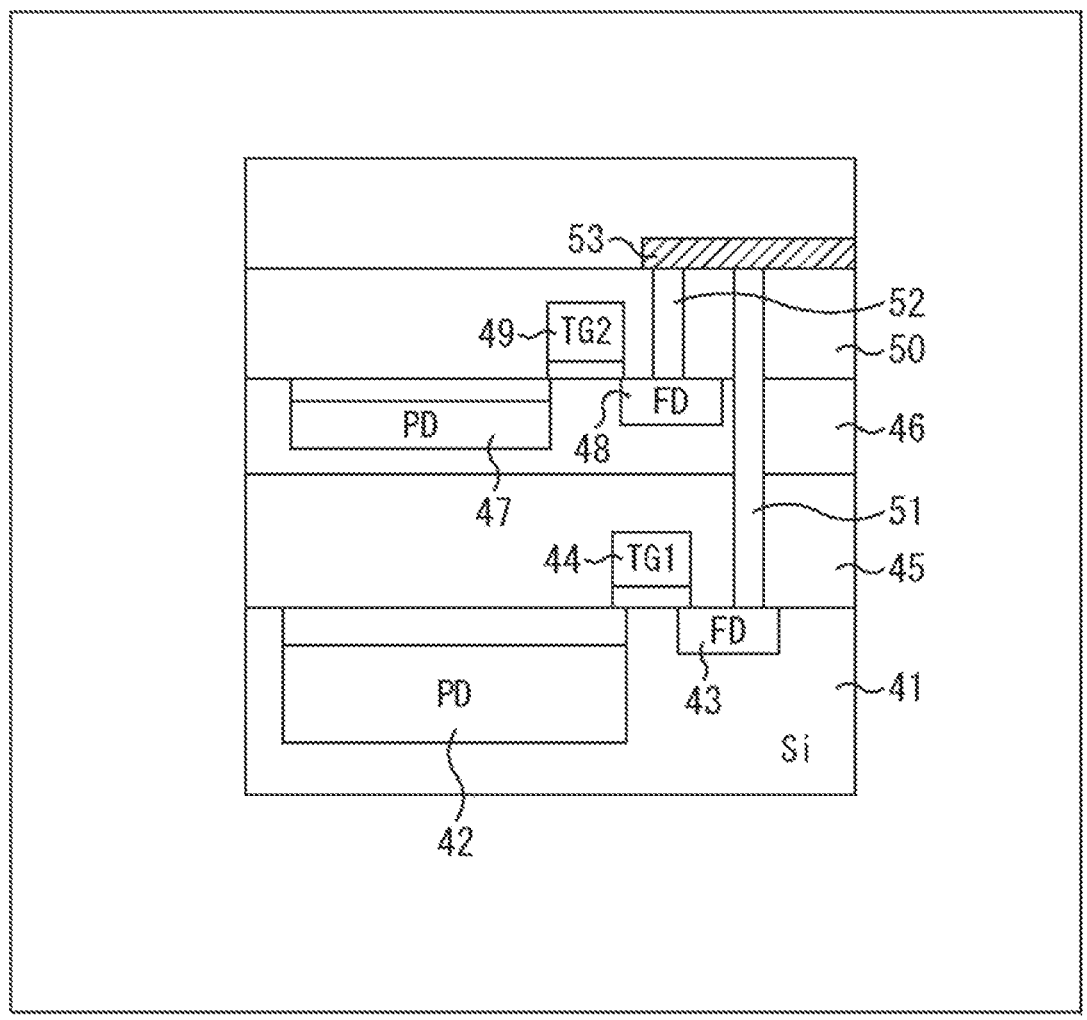
FIG. 8 is a diagram for explaining a process of pixel formation.

In step S18, as shown in the process in FIG. 8, a wiring layer is formed on the Si layer 46 (interlayer insulating film 50). In the wiring layer, the metal wiring 53 is formed so as to be connected to each of the contact vias 51, 52. As a result, the FD 43 is electrically connected to the metal wiring 53 via the contact via 51, and the FD 48 is electrically connected to the metal wiring 53 via the contact via 52. Furthermore, one end of the metal wiring 53 is connected to the amplification transistor 63 and the reset transistor 65.

Note that the pixel transistor such as the amplification transistor 63, the reset transistor 65, or the selection transistor 64 may be formed in the lower Si substrate 41 (first semiconductor layer) or in the upper Si layer (the second semiconductor layer) in the above-described processes. In the former case, the influence of heat received by the pixel transistor in the temperature process can be suppressed. In the latter case, as the distance from the metal wiring 53 is shortened, the electric resistance can be reduced.

In the pixel 21 formed in this manner, as shown in FIG. 2, when light is emitted from the lower side (rear side) in the drawing, visible light is mainly photoelectrically converted in the PD 42 of the lower layer (the first semiconductor layer 31), and infrared light is photoelectrically converted in the PD 42 of the lower layer and the PD 47 of the upper layer (the second semiconductor layer 32).

According to the above configuration and processing, it is possible to make a semiconductor layer be thicker so that sensitivity in the near infrared region can be improved, with only similar processes to conventional ones and without requiring a new investment for impurities implantation into a deep position or for a plurality of times of epitaxial growth as in a case of simply forming the PD deeply.

Furthermore, since the PD of the upper layer (the second semiconductor layer) is formed after the upper layer is bonded to the lower layer (the first semiconductor layer), a high accuracy is not required in bonding for adjusting the position of the PD of each layer.

Moreover, since the wiring layer is formed in a similar manner as the normal wiring process after the upper layer is bonded to the lower layer without forming an interlayer connector penetrating the Si layer by a special process, increase in the wiring forming processes can be reduced to the minimum.

As described above, according to the present embodiment, sensitivity in the near infrared region can be improved by a simpler process.

By the way, in an indirect transition type semiconductor such as Si or Ge, formation of an isoelectronic trap makes it possible to increase the photoelectric conversion efficiency and further improve the sensitivity.

3. Isoelectronic Trap

Figure 9:
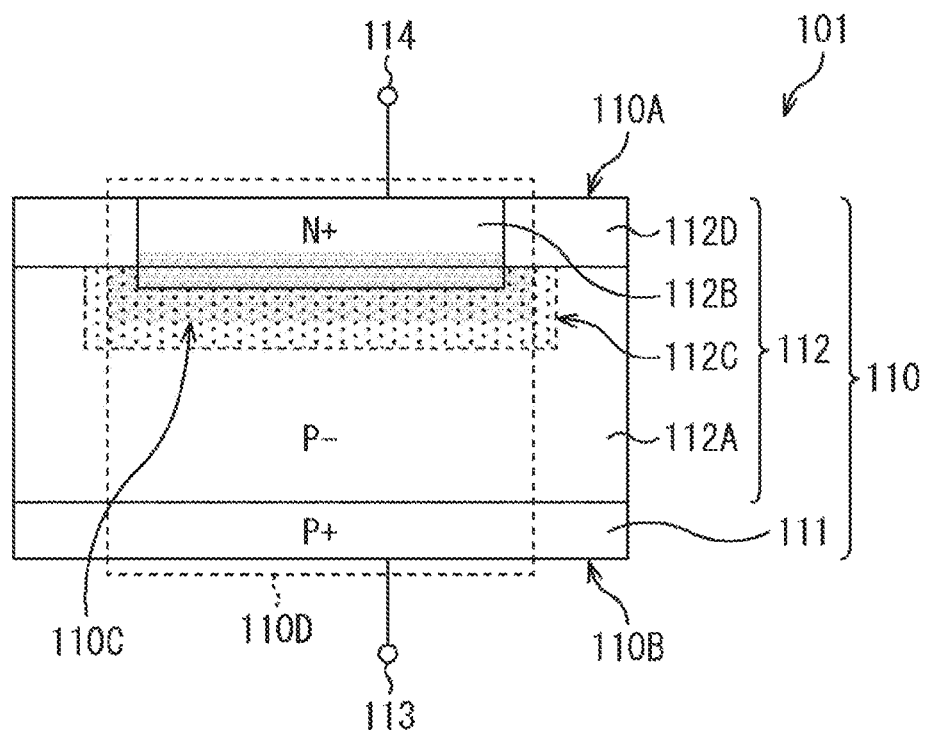
FIG. 9 is a diagram showing a configuration example of a photodiode.

FIG. 9 is a cross-sectional view showing a configuration example of a photodiode (PD).

The PD 101 in FIG. 9 includes a photoelectric conversion region 110D in which a depletion region 110C is formed by voltage application to the semiconductor layer 110, in the semiconductor layer 110. The depletion region 110C is a region in which electrons or holes as carriers hardly exist, and converts light incident from the light receiving surface 110A side into photoelectrons. The photoelectric conversion region 110D generates the depletion region 110C by voltage application and converts photoelectrons generated in the depletion region 110C into photocurrent when light enters the generated depletion region 110C.

In the semiconductor layer 110, the light receiving surface 110A is covered with an interlayer insulating film including, for example, a wiring and the like. The light receiving surface 110A includes an epitaxial growth layer 112. Furthermore, the bottom surface 110B includes a substrate 111.

The substrate 111 is a growth substrate when the epitaxial growth layer 112 is formed by the epitaxial crystal growth method in the manufacturing process. The substrate 111 and the epitaxial growth layer 112 include an indirect transition type semiconductor, and include, for example, Si, Ge, or a mixed crystal thereof (SiGe). Note that the substrate 111 may be removed by polishing in the manufacturing process.

Hereinafter, a configuration formed in the epitaxial growth layer 112 will be described assuming that the substrate 111 and the epitaxial growth layer 112 include a P type semiconductor.

The epitaxial growth layer 112 has an N region 112B on the light receiving surface 110A and is in contact with a P region 112A in the epitaxial growth layer 112.

The P region 112A includes a P type semiconductor, and has a P-type impurity concentration lower than the P type impurity concentration of the substrate 111 (for example, about 1E16 to 1E18 $cm^{-3}$), for example.

The N region 112B includes an N type semiconductor, and is formed, for example, by ion implantation of As into the epitaxial growth layer 112 at 5 to 100 keV and 1E14 to 5E15 $cm^{-3}$. A photoelectric conversion region 110D having a PN structure is formed in the laminating direction of the semiconductor layer 110 by the substrate 111, the P region 112A, and the N region 112B. In other words, the photoelectric conversion region 110D constitutes a PN type photodiode. In this case, the substrate 111 or the P region 112A serves as an anode region and the N region 112B serves as a cathode region.

The epitaxial growth layer 112 has an element separation region 112D in a region other than the N region 112B of the light receiving surface 110A. The element separation region 112D includes shallow trench isolation (STI) including, for example, silicon oxide and the like.

The PD 101 includes an anode electrode 113 electrically connected to the substrate 111 and a cathode electrode 114 electrically connected to the N region 112B. The anode electrode 113 and the cathode electrode 114 are terminals for externally applying a reverse bias voltage to the photoelectric conversion region 110D.

The epitaxial growth layer 112 further has an isoelectronic trap (IET) region 112C in a region where the depletion region 110C is formed, specifically, a region including the PN junction region of the photoelectric conversion region 110D. The IET region 112C contains Al and N as impurities. For example, the IET region 112C is formed by ion implantation of Al and N into the epitaxial growth layer 112 at about 5 to 50 keV and about 1E16 to 1E19 cm$^{-3}$, and then annealing at a temperature of 450° C. for about 20 to 200 hours. As a result of this long-time annealing, an Al—N pair forms a localized level.

Figure 10:
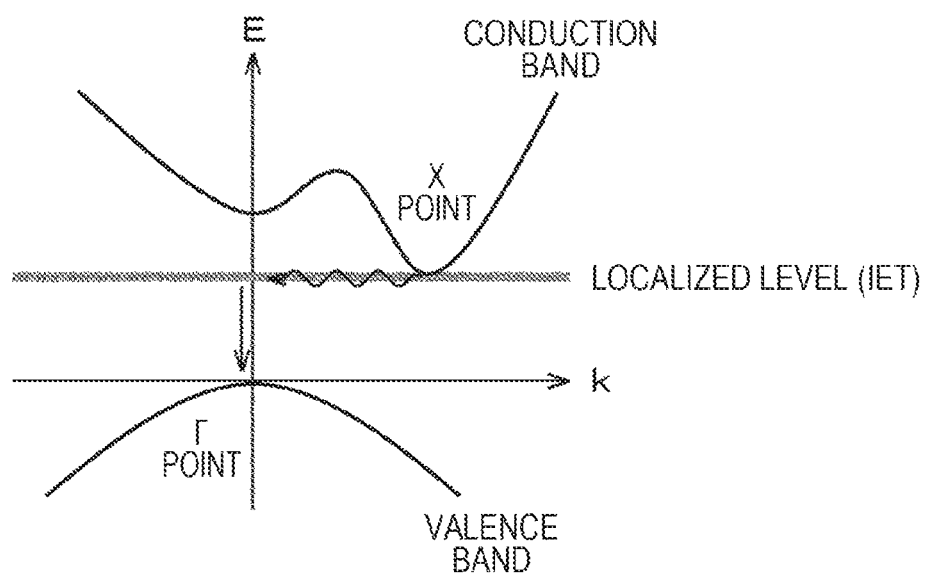
FIG. 10 is a diagram for explaining an IET.

FIG. 10 is a diagram showing energy levels in a wave number space in a case where an IET is formed in an indirect transition type semiconductor using Si as an example.

The formation of IET with Si is disclosed in detail in Non-Patent Documents 1 and 2 below.

Non-Patent Document 1: R. A. Modavis and D. G. Hall, "Aluminum-nitrogen isoelectronic trap in silicon", J. Appl. Phys. 67, p. 545 (1990)

Non-Patent Document 2: T. Mori et al., "Band-to-Band Tunneling Current Enhancement Utilizing Isoelectronic Trap and its Application to TFETs", VLSI Tech. Dig. 2014, p. 86, (2014)

According to Non-Patent Document 2, it is understood, from the result of photoluminescence, that the energy level of this IET is 1.126 eV and 1.122 eV at 10K and is located just below the conduction band. At this time, since the IET exists locally, the IET can be spread in the wave number space as shown in FIG. 10.

Normally, in order to recombine an electron in the conduction band with a hole in an indirect transition type semiconductor, phonon intervention is required due to the momentum conservation law. However, in a case where the IET exists, since the IET is spread in the wave number space, the momentum conservation law is relaxed. Thus, after electrons at the X point are captured at the IET level, transition to the Γ point can be made without requiring phonon intervention. Furthermore, in a case where electrons and holes are generated, a transition opposite to the transition described above occurs, and phonon intervention is not required, either.

Here, it is assumed that the IET region 112C is formed in a region where the depletion region 110C is formed, specifically, in a region including the PN junction region of the photoelectric conversion region 110D, and a reverse bias voltage is applied to the photoelectric conversion region 110D. At this time, the photoelectric conversion efficiency (sensitivity) greatly increases when the light receiving surface 110A of the PD 101 is irradiated with light and subjected to photoelectric conversion.

First, As was implanted into a P type Si substrate having a P type impurity concentration of about 5E16 cm$^{-3}$, and an N+ layer was formed on the surface. Thereafter, short-time annealing at 1000° C. was performed to activate the P type impurity, and then Al and N were implanted.

Next, annealing was performed at 450° C. for 24 hours to form the IET region 112C including Al—N, near the PN junction. LED light of various wavelengths was emitted thereto, and the photo current increase rate of the sample in which the IET region 112C was formed with respect to the one in which the IET region 112C was not formed was summarized.

Figure 11:
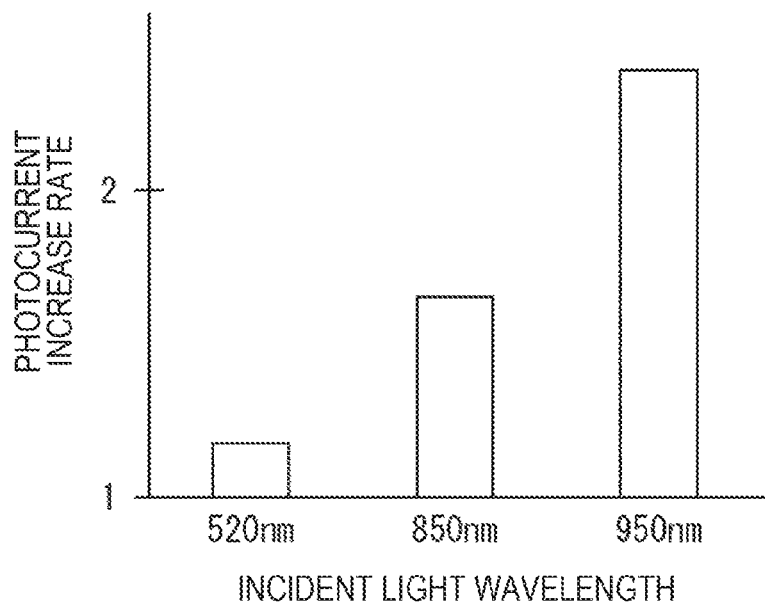
FIG. 11 is a diagram showing experimental results of the wavelength dependency of the photocurrent increase rate due to the IET.

FIG. 11 is a diagram showing the wavelength dependency of the photocurrent increase rate due to the IET.

As shown in FIG. 11, with the light in the visible light (green) region with a wavelength of 520 nm, the current increase rate due to the IET region 112C is about 1.2 times. Furthermore, photocurrent of about 1.7 times is obtained for light with a wavelength of 850 nm, which is a near infrared region, and photocurrent of about 2.4 times is obtained for light with a wavelength of 950 nm. This indicates that the sensitivity has greatly improved particularly in the near infrared region. In this manner, when the IET region 112C is formed in the photoelectric conversion region 110D, the sensitivity can be improved from the visible light of the indirect semiconductor such as Si or Ge particularly to the infrared region.

Therefore, the configuration in which the IET region is formed in the PD according to the embodiment of the present technology will be described below.

4. Second Embodiment

Figure 12:
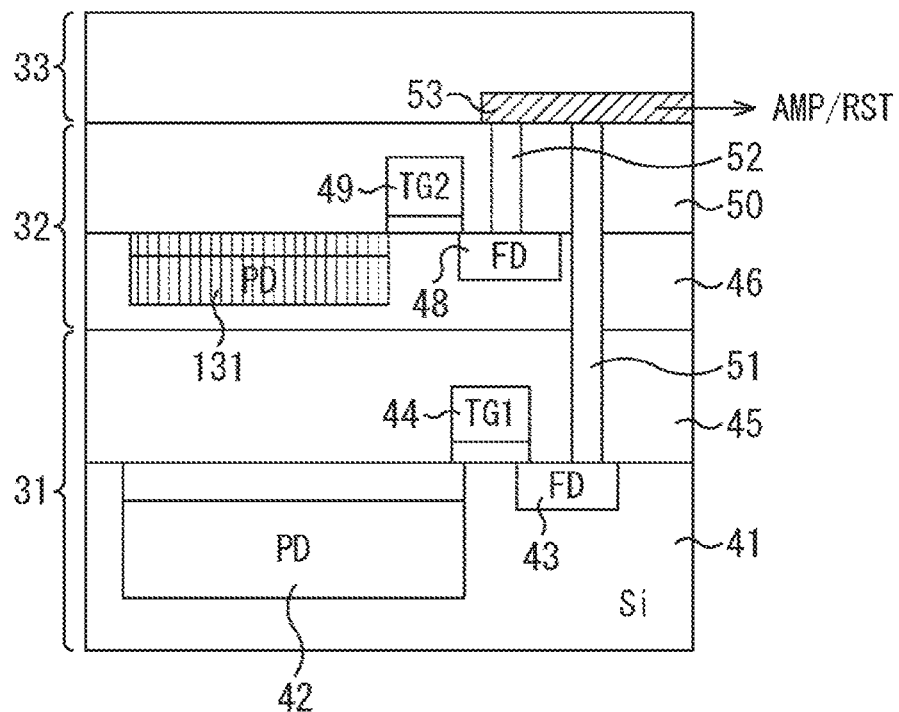
FIG. 12 is a cross-sectional view showing a configuration example of a pixel of a second embodiment.

FIG. 12 is a cross-sectional view showing a configuration example of a pixel 21A of a second embodiment.

Note that, in the pixel 21A shown in FIG. 12, the same name and the same reference numeral are attached to a component similar to the pixel 21 shown in FIG. 2, and description thereof will be omitted.

In the second semiconductor layer 32 of the pixel 21A, a PD 131 is formed in the Si layer 46. In the PD 131, the IET region described above is formed.

Next, with reference to the flowchart of FIG. 13, the flow of pixel formation of the present embodiment will be described.

Figure 13:
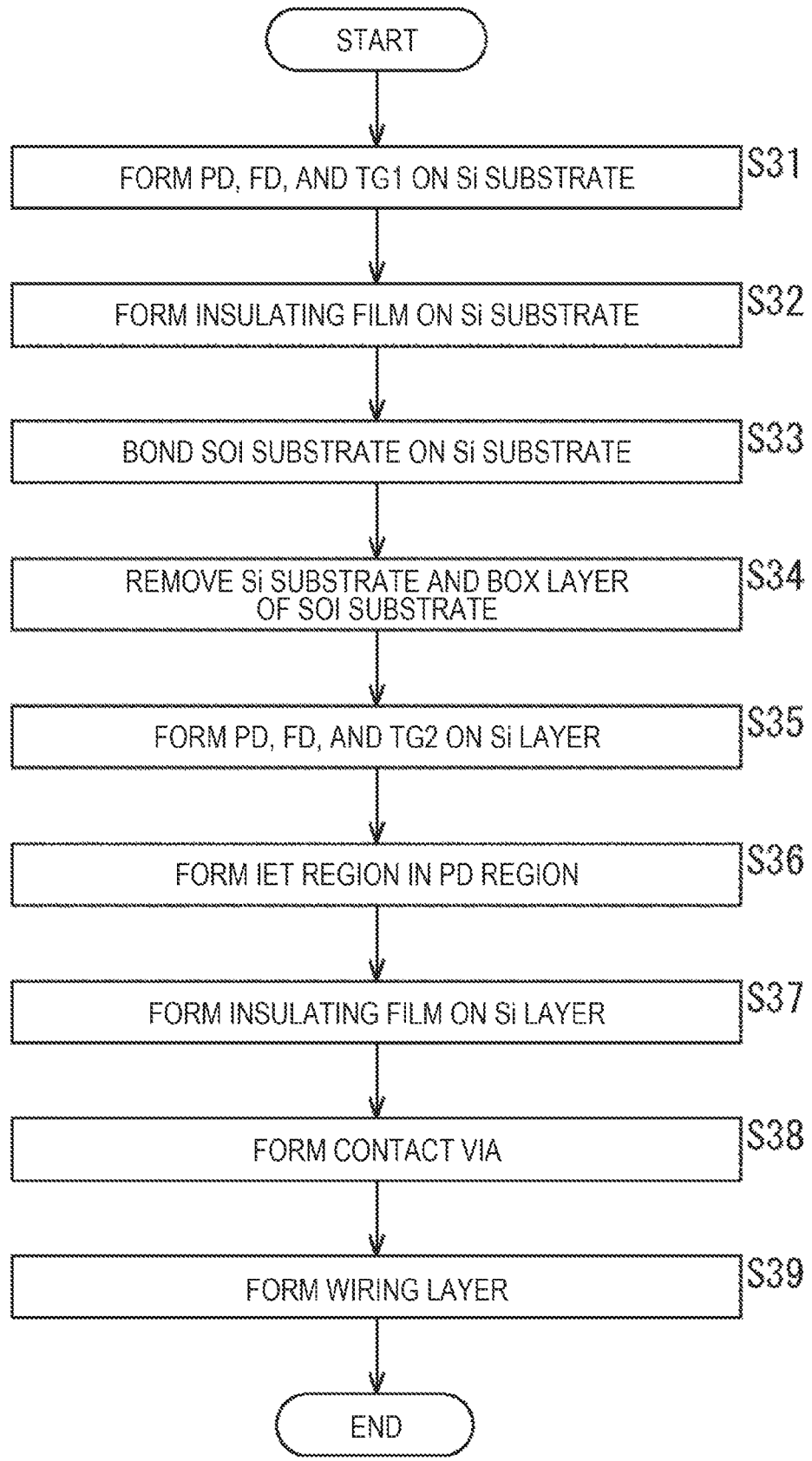
FIG. 13 is a flowchart for explaining pixel formation processing.

Note that, since similar processes to those in steps S11 to S18 of the pixel formation processing in FIG. 4 are performed in steps S31 to S35 and S37 to S39 of the pixel formation processing in FIG. 13, description thereof will be omitted.

In other words, after the PD 47, the FD 48, and the transfer transistor 49 (TG2) are formed in the second semiconductor layer 32 (the Si layer 46) in step S35, an IET region is formed in the PD (PD 48) in step S36.

Specifically, after ion implantation of Al and N into the PD 48 at, for example, about 5 to 200 keV and about 1E16 to 1E19 cm$^{-3}$, annealing is performed at a temperature of 400 to 500° C. for about 20 to 200 hours. As a result, an IET region is formed.

After the IET region is formed in this manner, the processes after step S37 are performed.

According to the above configuration and processing, it is possible not only to increase the thickness of the semiconductor layer but also to increase the photoelectric conversion efficiency of the infrared light in the PD in which the IET region is formed, and to further improve the sensitivity in the near infrared region.

5. Third Embodiment

Figure 14:
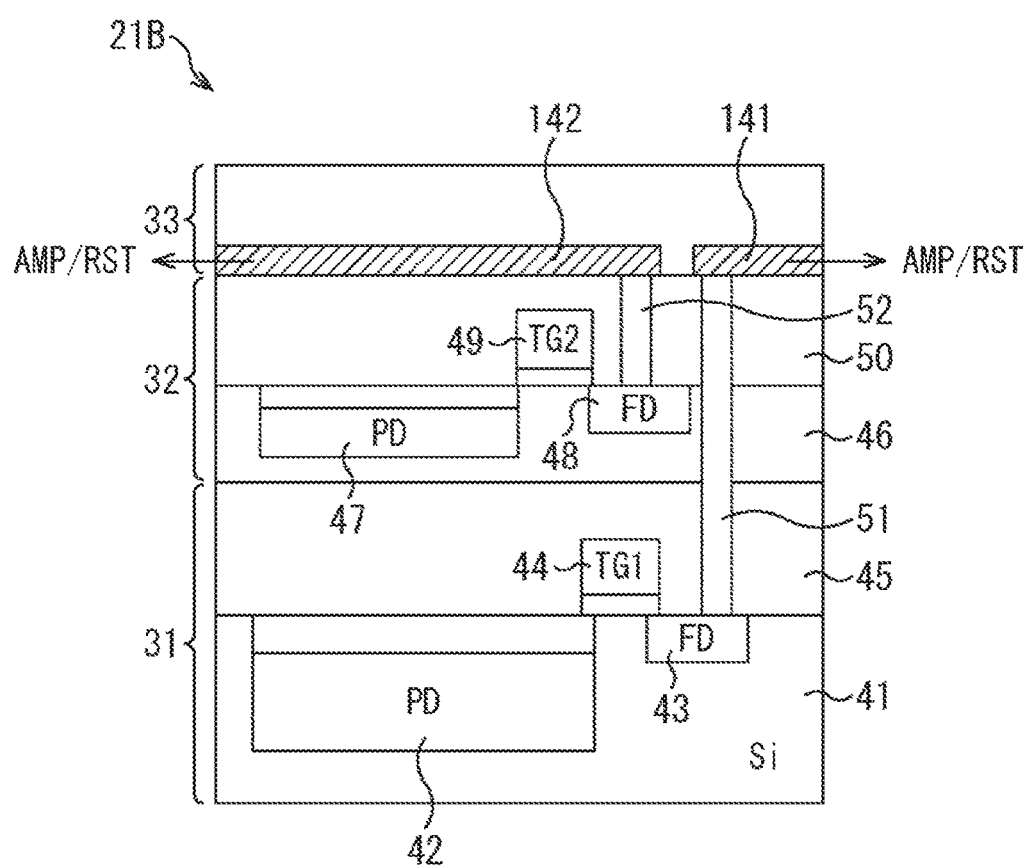
FIG. 14 is a cross-sectional view showing a configuration example of a pixel of a third embodiment.

FIG. 14 is a cross-sectional view showing a configuration example of a pixel 21B of a third embodiment.

Note that, in the pixel 21B shown in FIG. 14, the same name and the same reference numeral are attached to a component similar to the pixel 21 shown in FIG. 2, and description thereof will be omitted.

Metal wirings 141, 142 are formed in the wiring layer 33 of the pixel 21B.

One end of the metal wiring 141 is connected to an amplification transistor 152 or a reset transistor 154 as described later. Furthermore, the FD 43 of the first semiconductor layer 31 is electrically connected to the metal wiring 141 by the contact via 51.

One end of the metal wiring 142 is connected to an amplification transistor 162 or a reset transistor 164 as described later. Furthermore, the FD 48 of the second semiconductor layer 32 is electrically connected to the metal wiring 142 by the contact via 52.

Figure 15:
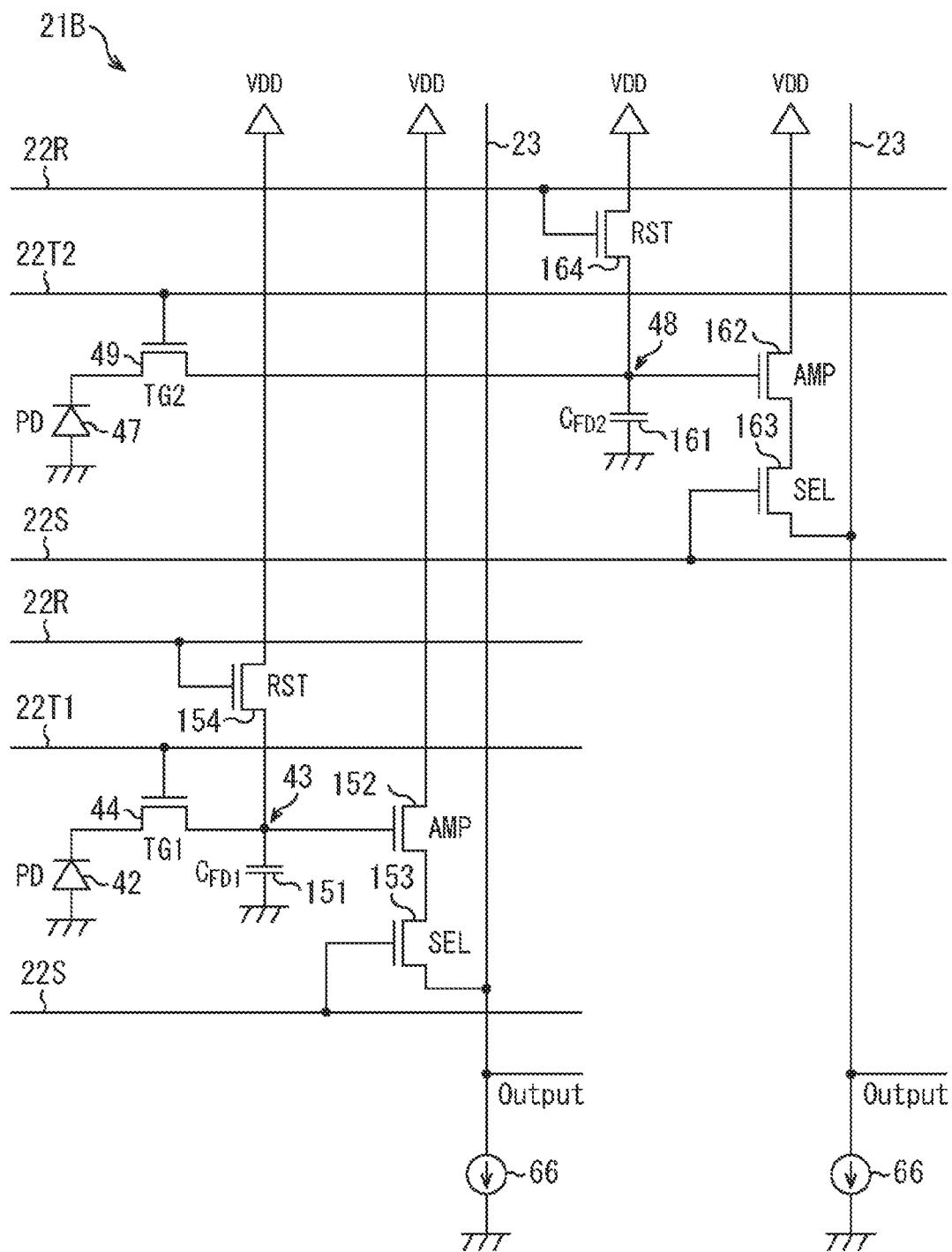
FIG. 15 is a circuit diagram showing a configuration example of the pixel.

FIG. 15 is a circuit diagram showing a configuration example of the pixel 21B.

The pixel 21B shown in FIG. 15 includes the PD 42, the transfer transistor 44 (TG1), the PD 47, the transfer transistor 49 (TG2), the amplification transistor 152, a selection transistor 153, the reset transistor 154, the amplification transistor 162, a selection transistor 163, and the reset transistor 164.

A connection point between the transfer transistor 44 and the amplification transistor 152 constitutes the FD 43. The FD 43 has a capacity 151 ($C_{FD1}$). Furthermore, a connection point between the transfer transistor 49 and the amplification transistor 162 constitutes the FD 48. The FD 48 has a capacity 161 ($C_{FD2}$).

In other words, in the pixel 21B, the FD 43 formed in the lower layer (the first semiconductor layer 31) and the FD 48 formed in the upper layer (the second semiconductor layer 32) are connected to different amplification transistors and reset transistors.

With such a configuration, it is possible to separately output a signal corresponding to visible light and a signal corresponding to infrared light.

Note that the pixel transistor such as the amplification transistor 152, the selection transistor 153, the reset transistor 154, the amplification transistor 162, the selection transistor 163, or the reset transistor 164 shown in FIG. 15 may be formed in the first semiconductor layer 31, or may be formed in the second semiconductor layer 32 in FIG. 14.

Furthermore, in the pixel 21B shown in FIG. 14, the PD 131 (FIG. 12) may be formed instead of the PD 47.

6. Fourth Embodiment

In the above description, in each pixel, the PD 42 is formed in the lower layer (the first semiconductor layer 31), and the PD 47 (the PD 131) is formed in the upper layer (the second semiconductor layer 32).

Figure 16:
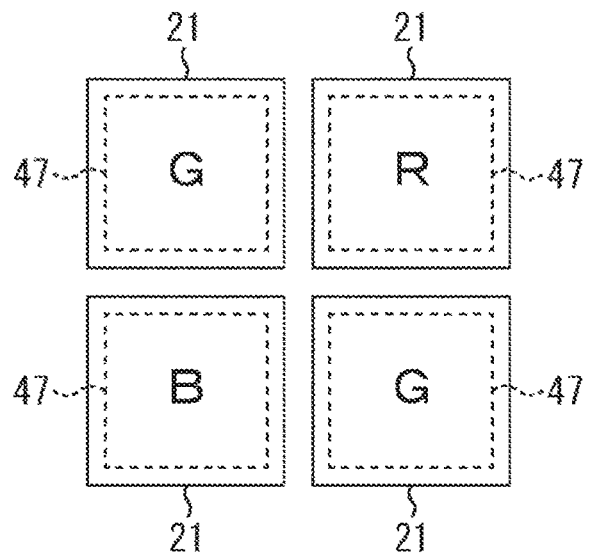
FIG. 16 is a diagram showing an arrangement example of a photodiode.

In other words, as shown in FIG. 16, the PD 47 (PD 131) is formed for each one pixel 21. In FIG. 16, although not shown, the PD 42 is also formed for every pixel 21. In other words, one PD 47 is formed for one pixel 21 (PD 42). Here, the PD 47 may be formed so as to overlap a part of the PD 42, or may be formed so as to overlap the entirety of the PD 42.

Figure 17:
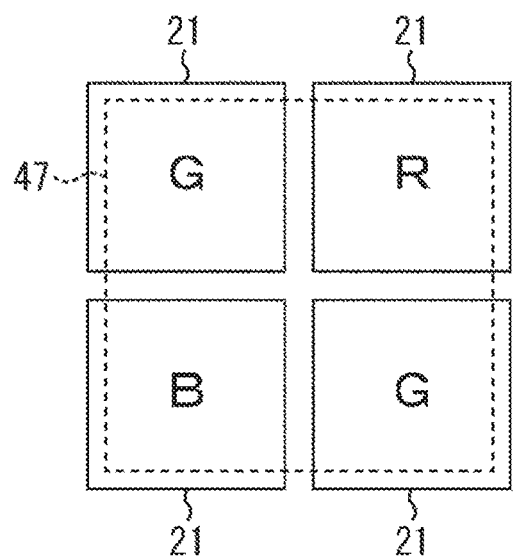
FIG. 17 is a diagram showing an arrangement example of a photodiode in a fourth embodiment.

The formation is not limited to the above, and as a fourth embodiment, as shown in FIG. 17, the PD 47 (PD 131) may be formed for each of the four pixels 21 of R, G, B, G arranged in, for example, a Bayer array. Here, the PD 47 may be formed so as to overlap a part of the PD 42 of the four pixels 21, or may be formed so as to overlap the entirety of the PD 42 of the four pixels 21.

Figure 18:
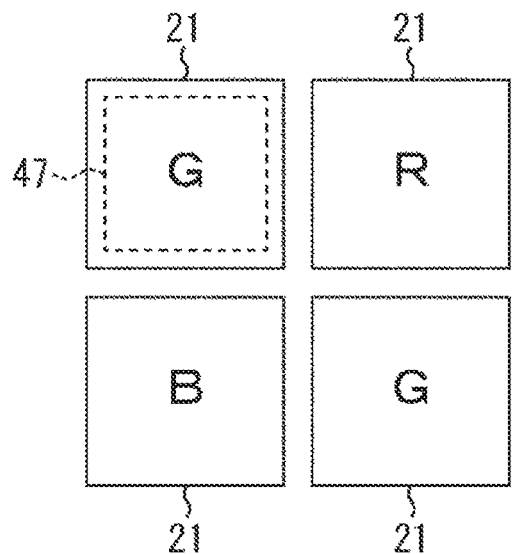
FIG. 18 is a diagram showing an arrangement example of a photodiode in the fourth embodiment.

Moreover, as shown in FIG. 18, the PD 47 (PD 131) may be formed in one of the four pixels 21 of R, G, B, G arranged in the Bayer arrangement.

Note that in the example of FIGS. 17 and 18, one PD 47 is formed for four pixels 21 (PD 42). However, one PD 47 may be formed for a plurality of pixels 21 (PD 42) other than the four.

7. Fifth Embodiment

Figure 19:
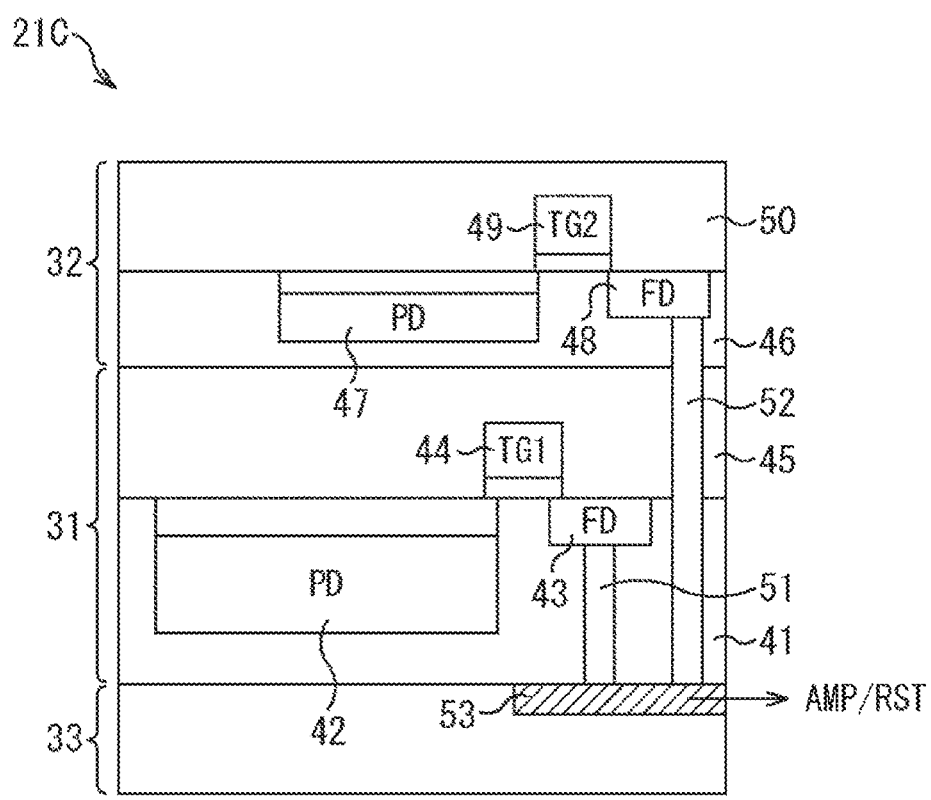
FIG. 19 is a cross-sectional view showing a configuration example of a pixel of a fifth embodiment.

FIG. 19 is a cross-sectional view showing a configuration example of a pixel 21C of a fifth embodiment.

Note that, in the pixel 21C shown in FIG. 19, the same name and the same reference numeral are attached to a component similar to the pixel 21 shown in FIG. 2, and description thereof will be omitted.

In the pixel 21C of FIG. 19, the wiring layer 33 is formed not in the upper layer than the second semiconductor layer but in the lower layer than the first semiconductor layer 31.

As described above, it is sufficient that the wiring layer 33 is formed in the side of the first semiconductor layer 31 or the second semiconductor layer 32, the side being opposite to a side on which the first semiconductor layer 31 and the second semiconductor layer 32 face each other (bonding surface between the first semiconductor layer 31 and the second semiconductor layer 32).

The solid-state imaging device 11 as described above can be applied to, for example, various electronic devices such as an imaging system such as a digital still camera or a digital video camera, a mobile phone having an imaging function, or another device having an imaging function.

8. Configuration Example of Electronic Device

Figure 20:
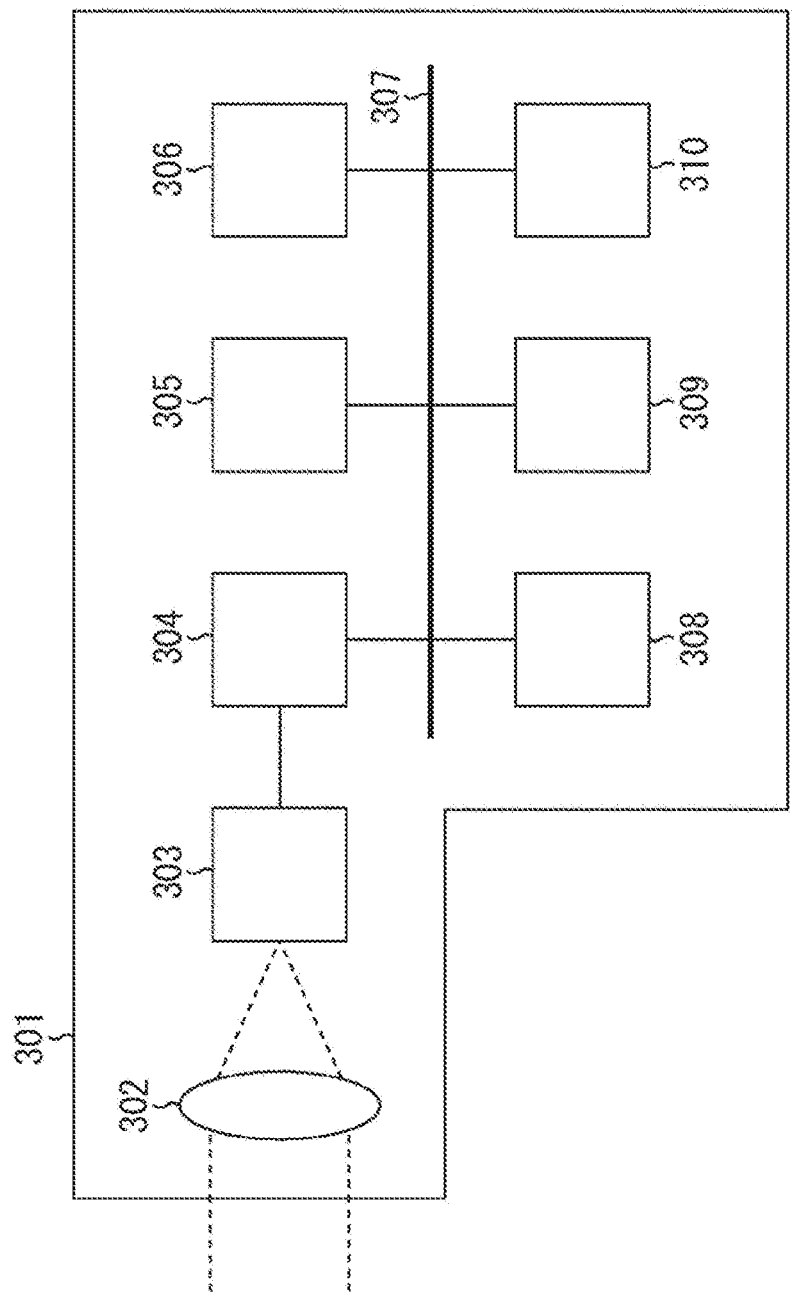
FIG. 20 is a block diagram showing a configuration example of an electronic device to which the present technology is applied.

FIG. 20 is a block diagram showing a configuration example of an imaging device as an electronic device to which the present technology is applied.

As shown in FIG. 20, an imaging device 301 includes an optical system 302, a solid-state imaging device 303, and a digital signal processor (DSP) 304, is connected via a bus 307 to the DSP 304, a display device 305, an operation system 306, a memory 308, a recording device 309, and a power supply system 310, and can capture still images and moving images.

The optical system 302 includes one or a plurality of lenses, guides image light (incident light) from a subject to the solid-state imaging device 303, and forms an image on a light receiving surface (sensor unit) of the solid-state imaging device 303.

As the solid-state imaging device 303, the solid-state imaging device 11 having the pixel 21 of any one of the configuration examples described above is applied. In the solid-state imaging device 303, electrons are accumulated for a certain period according to an image formed on the light receiving surface via the optical system 302. Then, a signal corresponding to the electrons accumulated in the solid-state imaging device 303 is supplied to the DSP 304.

The DSP 304 performs various types of signal processing on the signal from the solid-state imaging device 303 to acquire an image, and temporarily stores the data of the image in the memory 308. The data of the image stored in the memory 308 is recorded in the recording device 309 or is supplied to the display device 305 to display an image. Furthermore, the operation system 306 receives various types of operation by the user, and supplies operation signals to each block of the imaging device 301, and the power supply system 310 supplies electric power necessary for driving each block of the imaging device 301.

In the imaging device 301 configured as described above, applying the above-described solid-state imaging device 11 as the solid-state imaging device 303 makes it possible to improve the accuracy of sensing with infrared light.

Furthermore, the configuration of the solid-state imaging device according to the present technology can be adopted for a back-illuminated CMOS image sensor and a front-illuminated CMOS image sensor.

9. Usage Example of Image Sensor

Next, usage examples of an image sensor to which the present technology is applied will be described.

Figure 21:
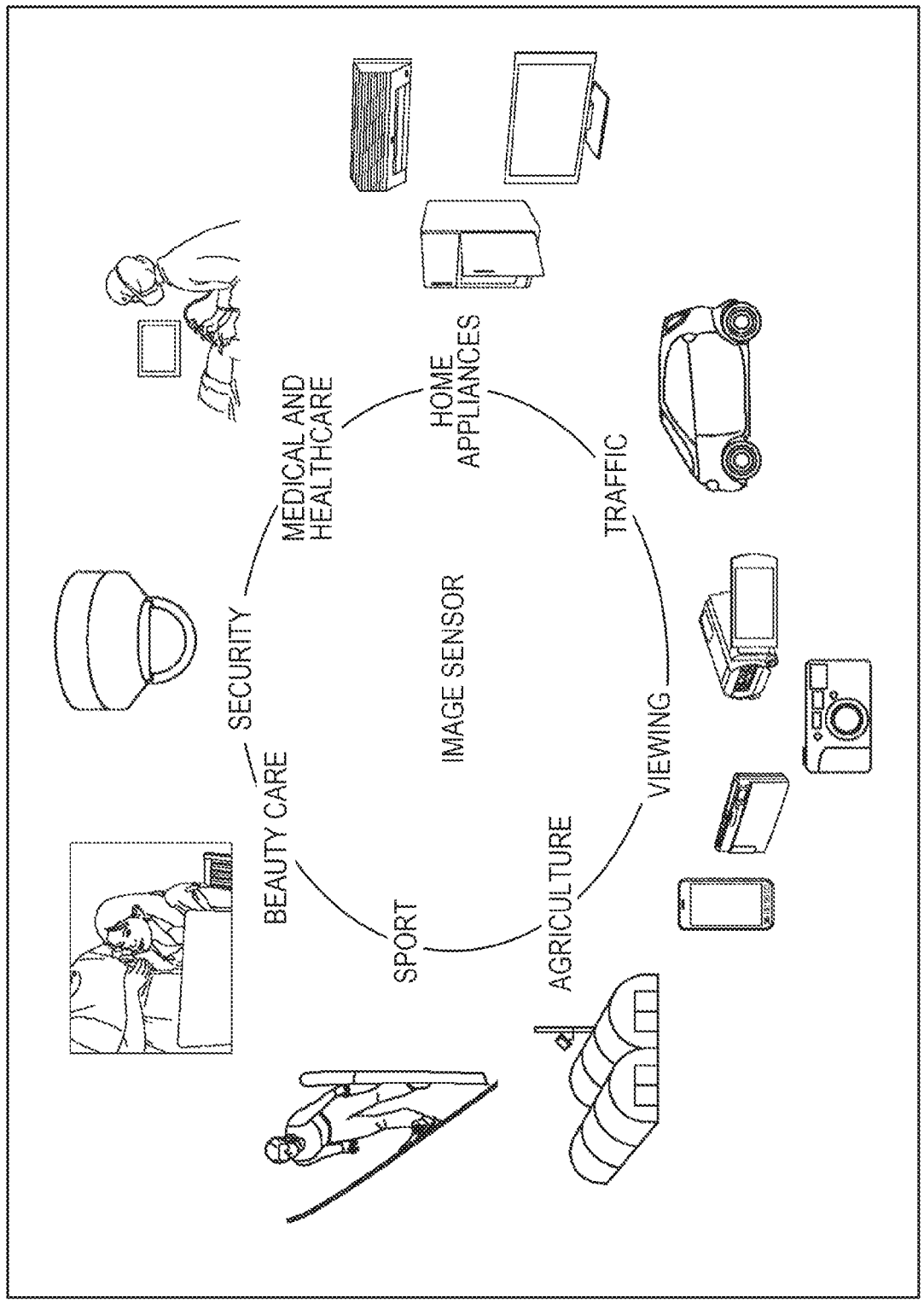
FIG. 21 is a diagram illustrating usage examples of an image sensor.

FIG. 21 is a diagram illustrating usage examples of an image sensor to which the present technology is applied.

The above-described image sensor can be used in various cases, for example, for sensing light such as visible light, infrared light, ultraviolet light, or X-rays, as described below.

- A device for photographing an image to be used for viewing, such as a digital camera, a portable device with a camera function
- A device used for traffic purpose such as: an in-vehicle sensor for photographing the front, rear, surroundings, inside of a car, or the like of an automobile for safe driving such as automatic stop and recognition of driver's condition or the like; a surveillance camera for monitoring traveling vehicles and roads; and a distance measuring sensor that measures the distance between vehicles or the like
- A device used for a home electrical appliance such as TV, refrigerator, and air conditioner, to photograph user's gesture and perform equipment operation according to the gesture
- A device used for medical and health care, such as an endoscope, or a device for performing angiography by receiving infrared light
- A device used for security such as a surveillance camera, and a camera for person authentication
- A device used for beauty care such as a skin measuring instrument for photographing skin, and a microscope for photographing the scalp
- A device used for sport such as an action camera or a wearable camera for sports applications or the like
- A device used for agriculture such as a camera for monitoring the condition of fields and crops

10. Application Example to Mobile Body

As described above, the technology according to the present disclosure can be applied to various products. For example, the technology according to the present disclosure may be realized as a device mounted on any type of mobile body such as a car, electric vehicle, hybrid electric vehicle, motorcycle, bicycle, personal mobility, airplane, drone, ship, or robot.

Figure 22:
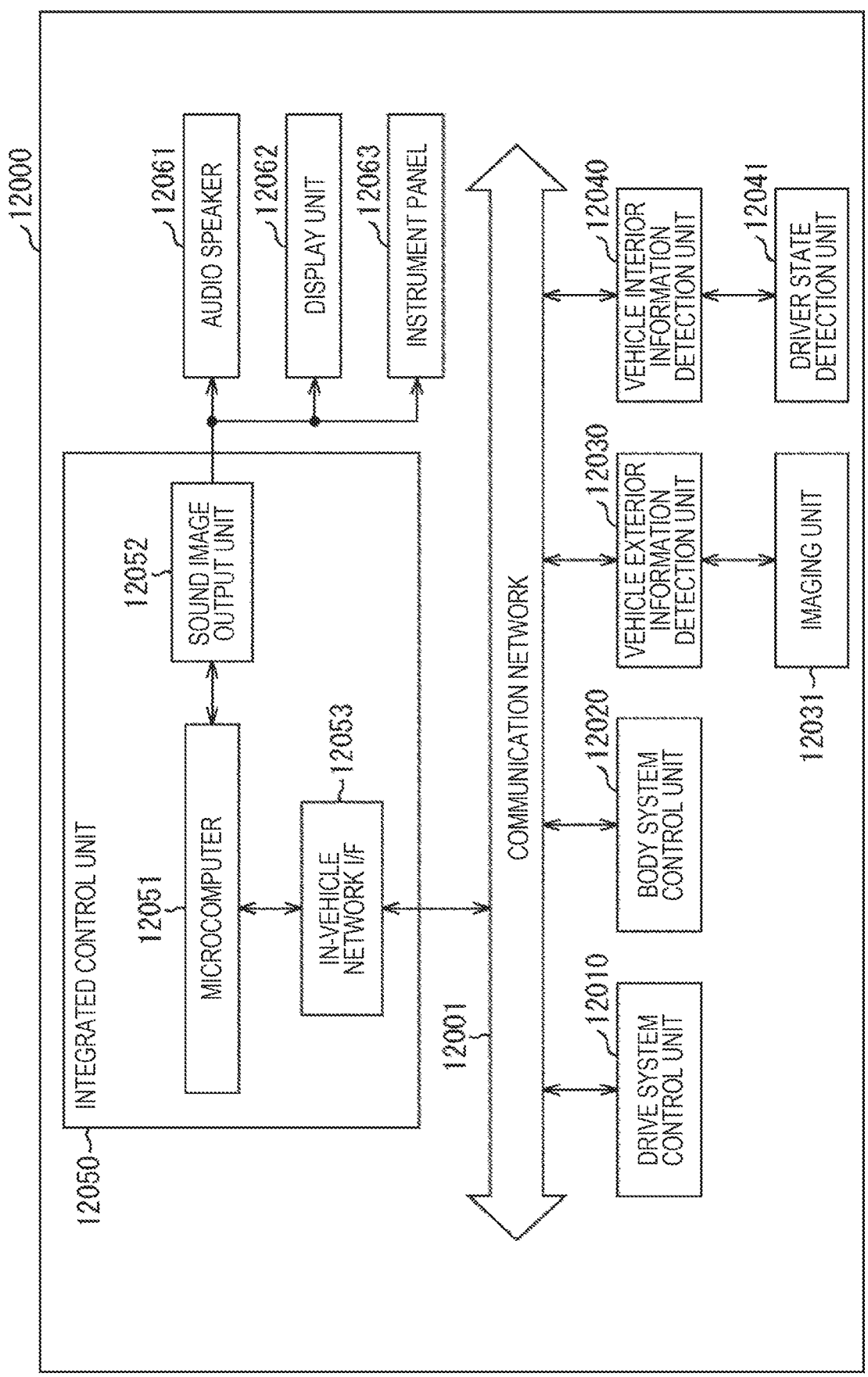
FIG. 22 is a block diagram showing a schematic configuration example of a vehicle control system.

FIG. 22 is a block diagram showing a schematic configuration example of a vehicle control system which is an example of a mobile body control system to which the technology according to the present disclosure can be applied.

The vehicle control system 12000 includes a plurality of electronic control units connected via a communication network 12001. In the example shown in FIG. 22, the vehicle control system 12000 includes a drive system control unit 12010, a body system control unit 12020, a vehicle exterior information detection unit 12030, a vehicle interior information detection unit 12040, and an integrated control unit 12050. Furthermore, as a functional configuration of the integrated control unit 12050, a microcomputer 12051, a sound image output unit 12052, and an in-vehicle network interface (I/F) 12053 are illustrated.

The drive system control unit 12010 controls the operation of devices related to the drive system of the vehicle according to various programs. For example, the drive system control unit 12010 functions as a control device for a driving force generating device for generating a driving force of a vehicle such as an internal combustion engine or a driving motor, a driving force transmitting mechanism for transmitting a driving force to the wheels, a steering mechanism that adjusts steering of a vehicle, a braking device that generates a braking force of a vehicle, or the like.

The body system control unit 12020 controls the operation of various devices equipped in a vehicle body according to various programs. For example, the body system control unit 12020 functions as a control device for a keyless entry system, a smart key system, a power window device, or various lamps such as a head lamp, a back lamp, a brake lamp, a turn indicator, or a fog lamp. In this case, a radio wave transmitted from a portable device that substitutes for a key or a signal of various switches may be input to the body system control unit 12020. The body system control unit 12020 receives the input of these radio waves or signals and controls a door lock device, a power window device, a lamp, or the like of the vehicle.

The vehicle exterior information detection unit 12030 detects information outside the vehicle on which the vehicle control system 12000 is mounted. For example, an imaging unit 12031 is connected to the vehicle exterior information detection unit 12030. The vehicle exterior information detection unit 12030 causes the imaging unit 12031 to capture an image of the exterior of the vehicle and receives the captured image. The vehicle exterior information detection unit 12030 may perform object detection processing or distance detection processing such as a person, a car, an obstacle, a sign, or a character on a road surface, on the basis of the received image.

The imaging unit 12031 is an optical sensor that receives light and outputs an electric signal corresponding to the amount of light received. The imaging unit 12031 can output an electric signal as an image or output the electric signal as distance measurement information. Furthermore, the light received by the imaging unit 12031 may be visible light or invisible light such as infrared light.

The vehicle interior information detection unit 12040 detects information inside the vehicle. For example, a driver state detection unit 12041 that detects the state of the driver is connected to the vehicle interior information detection unit 12040. The driver state detection unit 12041 includes, for example, a camera that images the driver, and the vehicle interior information detection unit 12040 may calculate the degree of fatigue or degree of concentration of the driver on the basis of the detection information input from the driver state detection unit 12041, or may determine whether or not the driver is dozing off.

The microcomputer 12051 can calculate a control target value of the driving force generating device, the steering mechanism or the braking device on the basis of the information inside and outside of the vehicle acquired by the vehicle exterior information detection unit 12030 or the vehicle interior information detection unit 12040, and can output a control command to the drive system control unit 12010. For example, the microcomputer 12051 can perform cooperative control for the purpose of realization of the function of advanced driver assistance system (ADAS) including collision avoidance or impact mitigation of the vehicle, follow-up running based on the distance between vehicles, vehicle speed maintenance running, vehicle collision warning, vehicle lane departure warning, or the like.

Furthermore, the microcomputer 12051 controls the driving force generating device, the steering mechanism, the braking device, or the like on the basis of the information regarding the surroundings of the vehicle acquired by the vehicle exterior information detection unit 12030 or the vehicle interior information detection unit 12040, so that the microcomputer 12051 can perform cooperative control for the purpose of, for example, automatic driving in which a vehicle autonomously runs without depending on the operation of the driver.

Furthermore, the microcomputer 12051 can output a control command to the body system control unit 12020 on the basis of the vehicle exterior information acquired by the vehicle exterior information detection unit 12030. For example, the microcomputer 12051 can control the headlamp according to the position of the preceding vehicle or the oncoming vehicle detected by the vehicle exterior information detection unit 12030, and perform cooperative control for the purpose of antiglare such as switching the high beam to low beam.

The sound image output unit 12052 transmits at least one of sound or image output signals to an output device capable of visually or audibly notifying the occupant of the vehicle or the outside of the vehicle, of information. In the example of FIG. 22, as an output device, an audio speaker 12061, a display unit 12062, and an instrument panel 12063 are illustrated. The display unit 12062 may include at least one of an on-board display or a head-up display, for example.

Figure 23:
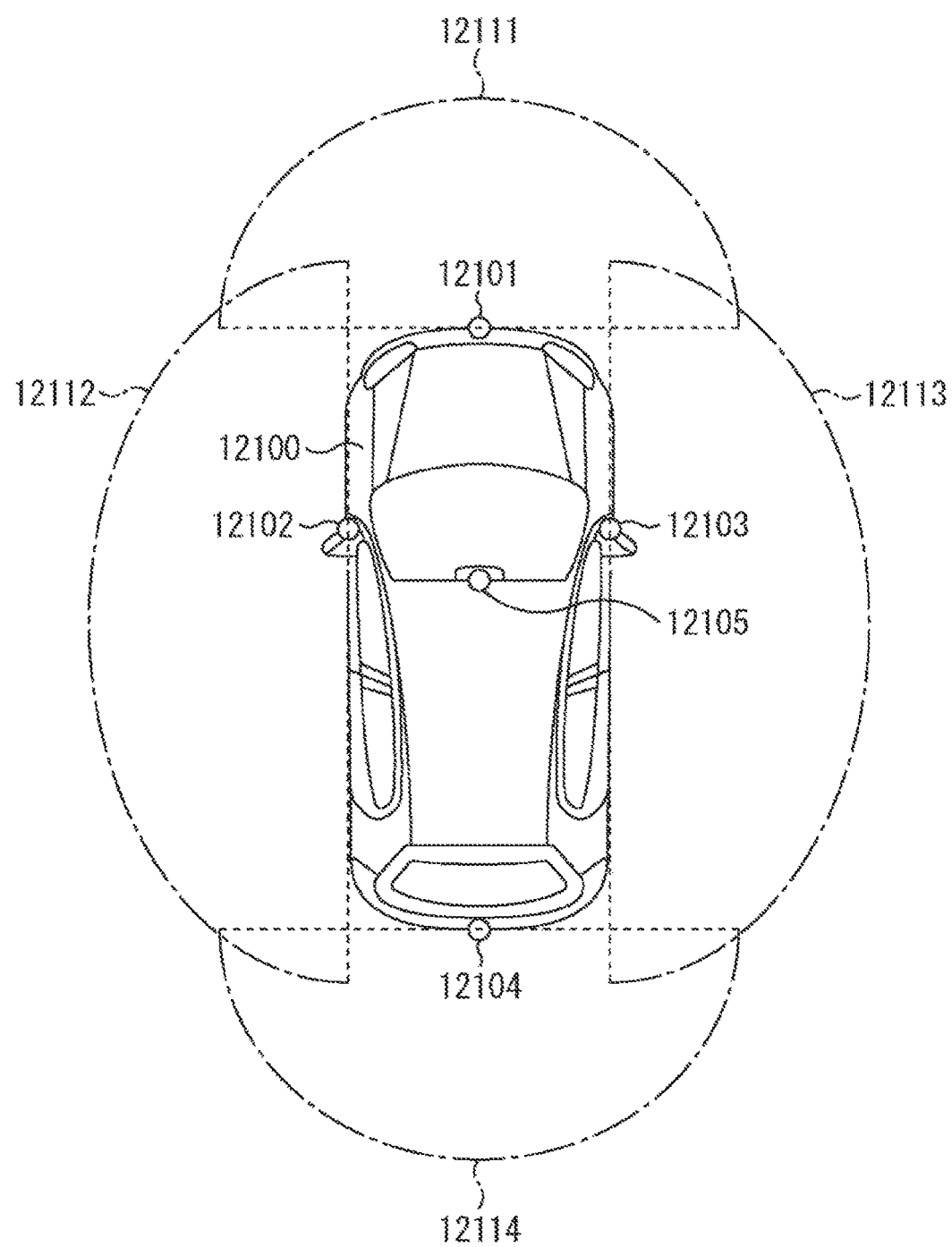
FIG. 23 is an explanatory diagram showing an example of installation positions of a vehicle exterior information detection unit and an imaging unit.

FIG. 23 is a diagram showing an example of an installation position of the imaging unit 12031.

In FIG. 23, as the imaging unit 12031, imaging units 12101, 12102, 12103, 12104, 12105 are included.

For example, the imaging units 12101, 12102, 12103, 12104, 12105 are provided at positions such as the front nose, the side mirror, the rear bumper, the back door, and the upper portion of the windshield in the vehicle compartment of the vehicle 12100. The imaging unit 12101 included in the front nose and the imaging unit 12105 included in the upper portion of the windshield in the vehicle compartment mainly acquire an image of the forward of the vehicle 12100. The imaging units 12102 and 12103 included in the side mirrors mainly acquire images of the sides of the vehicle 12100. The imaging unit 12104 included in the rear bumper or the back door mainly acquires images of the rearward of the vehicle 12100. The imaging unit 12105 included in the upper portion of the windshield in the vehicle compartment is mainly used for detection of a preceding vehicle, a pedestrian, an obstacle, a traffic signal, a traffic sign, a lane, or the like.

Note that FIG. 23 shows an example of the imaging range of the imaging units 12101 to 12104. An imaging range 12111 indicates an imaging range of the imaging unit 12101 provided in the front nose, the imaging ranges 12112, 12113 indicate the imaging range of the imaging units 12102, 12103 provided in the side mirror, respectively, and the imaging range 12114 indicates the imaging range of the imaging unit 12104 provided in the rear bumper or the back door. For example, by overlapping the image data imaged by the imaging units 12101 to 12104, an overhead view image of the vehicle 12100 viewed from above is obtained.

At least one of the imaging units 12101 to 12104 may have a function of acquiring distance information. For example, at least one of the imaging units 12101 to 12104 may be a stereo camera including a plurality of imaging elements, or may be an imaging element having a pixel for phase difference detection.

For example, the microcomputer 12051 obtains the distance to each three-dimensional object within the imaging range 12111 to 12114 and the temporal change of the distance (relative speed with respect to the vehicle 12100), on the basis of the distance information obtained from the imaging units 12101 to 12104, so that the microcomputer 12051 can extract a three-dimensional object that is the closest on the traveling path of the vehicle 12100 and runs at a predetermined speed (for example, 0 km/h or more) in substantially the same direction as that of the vehicle 12100, as a preceding vehicle. Moreover, the microcomputer 12051 can set an inter-vehicle distance to be secured in front of the preceding vehicle, and can perform automatic brake control (including follow-up stop control), automatic acceleration control (including follow-up start control), or the like. In this manner, it is possible to perform cooperative control for the purpose of automatic driving or the like that autonomously runs without depending on the operation of the driver.

For example, on the basis of the distance information obtained from the imaging units 12101 to 12104, the microcomputer 12051 can classify three-dimensional object data on the three-dimensional object into three-dimensional objects such as a two-wheeled vehicle, a regular vehicle, a large vehicle, a pedestrian, a telephone pole, and other three-dimensional objects, and extract the result to use the result for automatic avoidance of obstacles. For example, the microcomputer 12051 identifies an obstacle in the vicinity of the vehicle 12100 as an obstacle that the driver of the vehicle 12100 can see and an obstacle that is difficult to see. Then, the microcomputer 12051 determines the collision risk indicating the risk of collision with each obstacle, and when the collision risk is equal to or higher than a set value and there is a possibility of collision, the microcomputer 12051 can output an alarm to the driver via the audio speaker 12061 and the display unit 12062 or perform forced deceleration or avoiding steering via the drive system control unit 12010, so as to perform driving assistance for collision avoidance.

At least one of the imaging units 12101 to 12104 may be an infrared camera for detecting infrared rays. For example, the microcomputer 12051 can recognize a pedestrian by determining whether or not a pedestrian exists in the captured images of the imaging units 12101 to 12104. Such recognizing of a pedestrian is performed, for example, by a procedure of extracting feature points in the captured image of the imaging units 12101 to 12104 as an infrared camera and a procedure of performing pattern matching processing on a series of feature points indicating the outline of the object and discriminate whether or not it is a pedestrian. If the microcomputer 12051 determines that a pedestrian exists in the captured images of the imaging units 12101 to 12104 and recognizes the pedestrian, the sound image output unit 12052 controls the display unit 12062 to superimpose and display a rectangular contour line for emphasis on the recognized pedestrian. Furthermore, the sound image output unit 12052 may control the display unit 12062 to display icons or the like indicating pedestrians at desired positions.

An example of the vehicle control system to which the technology according to the present disclosure can be applied has been described above. The technology according to the present disclosure can be applied to the imaging unit 12031 in the above-described configuration. Specifically, the solid-state imaging device 11 of FIG. 1 can be applied to the imaging unit 12031. Applying the technique according to the present disclosure to the imaging unit 12031 makes it possible to improve the accuracy of sensing with infrared light, which in turn makes it possible to improve the accuracy of object detection processing and distance detection processing.

Note that the embodiments of the present technology are not limited to the above-described embodiments, and various modifications are possible without departing from the gist of the present technology.

Moreover, the present technology can adopt the following configuration.

(1)

A solid-state imaging device including:

a first semiconductor layer in which a first photoelectric conversion unit and a first floating diffusion are formed;

a second semiconductor layer in which a second photoelectric conversion unit and a second floating diffusion are formed; and a wiring layer including a wiring electrically connected to the first and second floating diffusions, in which the first semiconductor layer and the second semiconductor layer are laminated with each other, and the wiring layer is formed on a side of the first or the second semiconductor layer, the side being opposite to a side on which the first semiconductor layer and the second semiconductor layer face each other.

(2)

The solid-state imaging device described in (1), in which the second semiconductor layer is laminated on the first semiconductor layer, and the wiring layer is formed in an upper layer than the second semiconductor layer.

(3)

The solid-state imaging device described in (1) or (2), in which an isoelectronic trap is formed in the second photoelectric conversion unit.

(4)

The solid-state imaging device described in (3), in which the second semiconductor layer includes Si, Ge, or SiGe.

(5)

The solid-state imaging device described in (3), in which the second semiconductor layer includes a III-V compound.

(6)

The solid-state imaging device described in any of (1) to (5), in which the first and second floating diffusions are electrically connected to the wiring by first and second contact vias that are formed separately.

(7)

The solid-state imaging device described in (6), in which the first floating diffusion is electrically connected to a first wiring by the first contact via, and the second floating diffusion is electrically connected to a second wiring different from the first wiring by the second contact via.

(8)

The solid-state imaging device described in any of (1) to (7), in which the first and second photoelectric conversion units are formed for every pixel.

(9)

The solid-state imaging device described in (8), in which the second photoelectric conversion unit is formed so as to overlap a part or the entirety of the first photoelectric conversion unit.

(10)

The solid-state imaging device described in any of (1) to (7), in which the first photoelectric conversion unit is formed for every pixel, and the second photoelectric conversion unit is formed for every set of a plurality of pixels.

(11)

The solid-state imaging device described in (10), in which the second photoelectric conversion unit is formed so as to overlap a part or the entirety of the first photoelectric conversion unit of the plurality of pixels.

(12)

The solid-state imaging device described in (1), in which the second semiconductor layer is laminated on the first semiconductor layer, and the wiring layer is formed in a lower layer than the first semiconductor layer.

(13)

A manufacturing method of a solid-state imaging device including steps of:

forming a first photoelectric conversion unit and a first floating diffusion in a first semiconductor layer;

laminating a second semiconductor layer on the first semiconductor layer;

forming a second photoelectric conversion unit and a second floating diffusion in the second semiconductor layer; and forming a wiring layer including a wiring electrically connected to the first and second floating diffusions on a side of the first or the second semiconductor layer, the side being opposite to a side on which the first semiconductor layer and the second semiconductor layer face each other.

(14)

An electronic device including a solid-state imaging device including:

a first semiconductor layer in which a first photoelectric conversion unit and a first floating diffusion are formed;

a second semiconductor layer in which a second photoelectric conversion unit and a second floating diffusion are formed; and a wiring layer including a wiring electrically connected to the first and second floating diffusions, in which the first semiconductor layer and the second semiconductor layer are laminated with each other, and the wiring layer is formed on a side of the first or the second semiconductor layer, the side being opposite to a side on which the first semiconductor layer and the second semiconductor layer face each other.

REFERENCE SIGNS LIST

11 Solid-state imaging device
21, 21A, 21B, 21C Pixel
31 First semiconductor layer
32 Second semiconductor layer
33 Wiring layer
41 Si substrate
42 PD
43 FD
44 Transfer transistor
45 Interlayer insulating film
46 Si layer
47 PD
48 FD
49 Transfer transistor
50 Interlayer insulating film 51, 52 Contact via
53 Metal wiring
131 PD
141, 142 Metal wiring
301 Electronic device
303 Solid-state imaging device

The invention claimed is:

1. A solid-state imaging device, comprising:
a first semiconductor layer including a first photoelectric conversion unit and a first floating diffusion;
a second semiconductor layer including a second photoelectric conversion unit and a second floating diffusion, wherein the second photoelectric conversion unit includes an isoelectronic trap; and
a wiring layer including a wiring electrically connected to the first floating diffusion and the second floating diffusion, wherein
the second semiconductor layer is on the first semiconductor layer,
the wiring layer is on a side of one of the first semiconductor layer or the second semiconductor layer, and
the side of the one of the first semiconductor layer or the second semiconductor layer is opposite to a side on which the first semiconductor layer faces the second semiconductor layer.

2. The solid-state imaging device according to claim 1, wherein the wiring layer is on the second semiconductor layer.

3. The solid-state imaging device according to claim 1, wherein the second semiconductor layer includes at least one of Si, Ge, or SiGe.

4. The solid-state imaging device according to claim 1, wherein the second semiconductor layer includes a III-V compound.

5. The solid-state imaging device according to claim 1, further comprising:
a first contact via that electrically connects the first floating diffusion to the wiring; and
a second contact via that electrically connects the second floating diffusion to the wiring.

6. The solid-state imaging device according to claim 5, wherein
the wiring layer further includes a first wiring and a second wiring different from the first wiring,
the first contact via electrically connects the first floating diffusion to the first wiring, and
the second contact via electrically connects the second floating diffusion to the second wiring.

7. The solid-state imaging device according to claim 1, further comprising a plurality of pixels, wherein each pixel of the plurality of pixels includes the first photoelectric conversion unit and the second photoelectric conversion unit.

8. The solid-state imaging device according to claim 7, wherein the second photoelectric conversion unit overlaps a part of the first photoelectric conversion unit or an entirety of the first photoelectric conversion unit.

9. The solid-state imaging device according to claim 1, further comprising a plurality of pixels, wherein
each pixel of the plurality of pixels includes the first photoelectric conversion unit, and
each set of pixels of a plurality of sets of pixels of the plurality of pixels includes the second photoelectric conversion unit.

10. The solid-state imaging device according to claim 9, wherein the second photoelectric conversion unit overlaps a part of the first photoelectric conversion unit of a set of pixels of the plurality of sets of pixels or an entirety of the first photoelectric conversion unit of the set of pixels.

11. The solid-state imaging device according to claim 1, wherein the first semiconductor layer is on the wiring layer.

12. An electronic device, comprising:
a solid-state imaging device including:
a first semiconductor layer including a first photoelectric conversion unit and a first floating diffusion;
a second semiconductor layer including a second photoelectric conversion unit and a second floating diffusion, wherein the second photoelectric conversion unit includes an isoelectronic trap; and
a wiring layer including a wiring electrically connected to the first floating diffusion and the second floating diffusion, wherein
the second semiconductor layer is on the first semiconductor layer,
the wiring layer is on a side of one of the first semiconductor layer or the second semiconductor layer, and
the side of the one of the first semiconductor layer or the second semiconductor layer is opposite to a side on which the first semiconductor layer faces the second semiconductor layer.

13. A solid-state imaging device, comprising:
a first semiconductor layer including a first photoelectric conversion unit and a first floating diffusion;
a second semiconductor layer including a second photoelectric conversion unit and a second floating diffusion;
a wiring layer including a wiring electrically connected to the first floating diffusion and the second floating diffusion, wherein
the second semiconductor layer is on the first semiconductor layer, and
the first semiconductor layer is on the wiring layer;
a first contact via that electrically connects the first floating diffusion to the wiring; and
a second contact via that electrically connects the second floating diffusion to the wiring.

14. A manufacturing method of a solid-state imaging device, comprising:
forming a first photoelectric conversion unit and a first floating diffusion in a first semiconductor layer;
laminating a second semiconductor layer on the first semiconductor layer;
forming a second photoelectric conversion unit and a second floating diffusion in the second semiconductor layer;
forming an isoelectronic trap in the second photoelectric conversion unit; and
forming a wiring layer on a side of one of the first semiconductor layer or the second semiconductor layer, wherein
the wiring layer includes a wiring electrically connected to the first floating diffusion and the second floating diffusion, and
the side of the one of the first semiconductor layer or the second semiconductor layer is opposite to a side on which the first semiconductor layer faces the second semiconductor layer.

* * * * *